(12) United States Patent
Yamazaki et al.

(10) Patent No.: US 6,855,957 B1
(45) Date of Patent: Feb. 15, 2005

(54) SEMICONDUCTOR DEVICE AND MANUFACTURING METHOD THEREOF

(75) Inventors: Shunpei Yamazaki, Tokyo (JP); Jun Koyama, Kanagawa (JP)

(73) Assignee: Semiconductor Energy Laboratory Co., Ltd., Kanagawa-ken (JP)

(*) Notice: Subject to any disclaimer, the term of this patent is extended or adjusted under 35 U.S.C. 154(b) by 0 days.

(21) Appl. No.: 09/566,722

(22) Filed: May 9, 2000

(30) Foreign Application Priority Data

Mar. 13, 2000 (JP) ..................................... 2000-069519

(51) Int. Cl.[7] ............................................. H01L 29/04
(52) U.S. Cl. ........................ 257/72; 257/59; 257/347; 257/309; 257/57; 257/52; 257/53; 257/83
(58) Field of Search .............................. 257/72, 59, 57, 257/347, 309, 52, 53, 83

(56) References Cited

U.S. PATENT DOCUMENTS

| | | | |
|---|---|---|---|
| 4,624,737 A | | 11/1986 | Shimbo |
| 4,960,719 A | | 10/1990 | Tanaka et al. |
| 5,028,551 A | | 7/1991 | Dohjo et al. |
| 5,151,806 A | * | 9/1992 | Kawamoto et al. ............ 359/59 |
| 5,362,660 A | * | 11/1994 | Kwasnick et al. ............. 437/40 |
| 5,478,766 A | * | 12/1995 | Park et al. ..................... 437/40 |
| 5,532,180 A | * | 7/1996 | den Boer et al. ............. 437/40 |
| 5,539,219 A | * | 7/1996 | den Boer et al. ............. 257/59 |
| 5,583,675 A | | 12/1996 | Yamada et al. |
| 5,668,379 A | | 9/1997 | Ono et al. |
| 5,706,064 A | | 1/1998 | Fukunaga et al. |
| 5,739,880 A | | 4/1998 | Suzuki et al. |
| 5,757,453 A | * | 5/1998 | Shin et al. .................. 349/122 |
| 5,757,456 A | | 5/1998 | Yamazaki et al. |
| 5,766,977 A | | 6/1998 | Yamazaki |

(List continued on next page.)

FOREIGN PATENT DOCUMENTS

| | | |
|---|---|---|
| JP | 05323371 | * 12/1993 |
| JP | 07-014880 | 1/1995 |
| JP | 09-015621 | 1/1997 |
| JP | 09-054318 | 2/1997 |
| JP | 09-152626 | 6/1997 |
| JP | 11-109372 | 4/1999 |
| JP | 11-160734 | 6/1999 |
| JP | 11-202368 | 6/1999 |
| JP | 11-258596 | 9/1999 |

OTHER PUBLICATIONS

Application Serial No. 10/144,067, "Semiconductor Device and Manufacturing Method Thereof".
Wolf et al., "Chemical Vapor Deposition of Amorphous and Polycrystalline Thin Films", pp. 161–175, 335, 1986, Silicon Processing for the VLSI Era, vol. 1, Process Technology.
Application Serial No. 09/566,733, Filed May 9, 2000.
U.S. Patent Application Ser. No. 09/635,945; Filed Aug. 10, 2000; Inventors: Setsuo Nakajima et al.; "Semiconductor Device and Method of Manufacturing the Semiconductor Device" (Filing Receipt, Specification, Claims & Drawings).

*Primary Examiner*—Eddie Lee
*Assistant Examiner*—Eugene Lee
(74) *Attorney, Agent, or Firm*—Nixon Peabody LLP; Jeffrey L. Costellia

(57) ABSTRACT

A TFT is manufactured using at least five photomasks in a conventional liquid crystal display device, and therefore the manufacturing cost is high. By performing the formation of the pixel electrode, the source region and the drain region by using three photomasks in three photolithography steps, a liquid crystal display device prepared with a pixel TFT portion, having a reverse stagger type n-channel TFT, and a storage capacitor can be realized.

56 Claims, 18 Drawing Sheets

U.S. PATENT DOCUMENTS

| | | | |
|---|---|---|---|
| 5,811,318 A | 9/1998 | Kweon | |
| 5,821,138 A | 10/1998 | Yamazaki et al. | |
| 5,825,449 A | 10/1998 | Shin | |
| 5,834,327 A | 11/1998 | Yamazaki et al. | |
| 5,867,233 A | 2/1999 | Tanaka | |
| 5,892,562 A | 4/1999 | Yamazaki et al. | |
| 5,917,567 A * | 6/1999 | Oh et al. | 349/113 |
| 5,959,599 A | 9/1999 | Hirakata | |
| 5,966,189 A * | 10/1999 | Matsuo | 349/38 |
| 5,977,562 A | 11/1999 | Hirakata et al. | |
| 5,986,724 A | 11/1999 | Akiyama et al. | |
| 5,990,998 A * | 11/1999 | Park et al. | 349/139 |
| 5,995,190 A | 11/1999 | Nagae et al. | |
| 5,998,229 A | 12/1999 | Lyu et al. | |
| 6,008,869 A | 12/1999 | Oana et al. | |
| 6,025,892 A | 2/2000 | Kawai et al. | |
| 6,055,028 A | 4/2000 | Nishi et al. | |
| 6,064,456 A | 5/2000 | Taniguchi et al. | |
| 6,075,257 A * | 6/2000 | Song | 257/59 |
| 6,097,458 A * | 8/2000 | Tsuda et al. | 349/113 |
| 6,097,459 A | 8/2000 | Shimada et al. | |
| 6,097,465 A | 8/2000 | Hiroki et al. | |
| 6,114,184 A * | 9/2000 | Matsumoto et al. | 438/30 |
| 6,118,502 A | 9/2000 | Yamazaki et al. | |
| 6,124,606 A * | 9/2000 | den Boer et al. | 257/291 |
| 6,160,600 A | 12/2000 | Yamazaki et al. | |
| 6,188,452 B1 | 2/2001 | Kim et al. | |
| 6,190,933 B1 | 2/2001 | Shimabukuro et al. | |
| 6,197,625 B1 | 3/2001 | Choi | |
| 6,208,390 B1 | 3/2001 | Ejiri et al. | |
| 6,208,395 B1 | 3/2001 | Kanoh et al. | |
| 6,218,221 B1 * | 4/2001 | Sah | 438/158 |
| 6,255,668 B1 | 7/2001 | Kang et al. | |
| 6,266,117 B1 * | 7/2001 | Yanagawa et al. | 349/141 |
| 6,266,121 B1 | 7/2001 | Shigeta et al. | |
| 6,323,051 B1 | 11/2001 | Shimada | |
| 6,339,462 B1 | 1/2002 | Kishimoto et al. | |
| 6,387,737 B1 | 5/2002 | Yamazaki et al. | |

\* cited by examiner

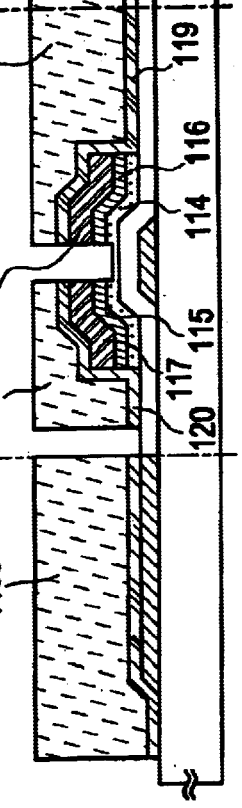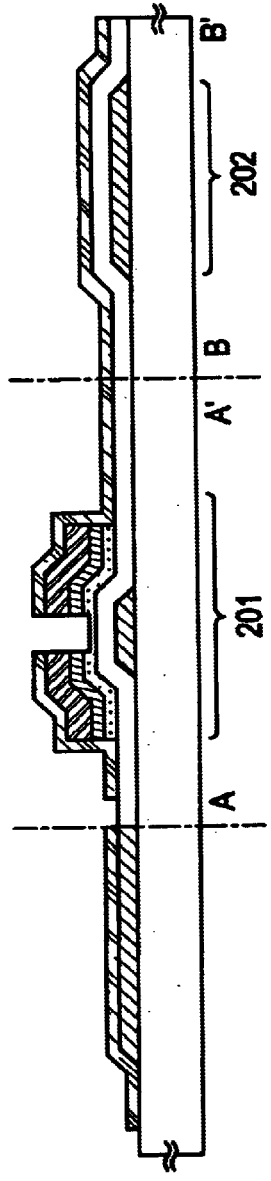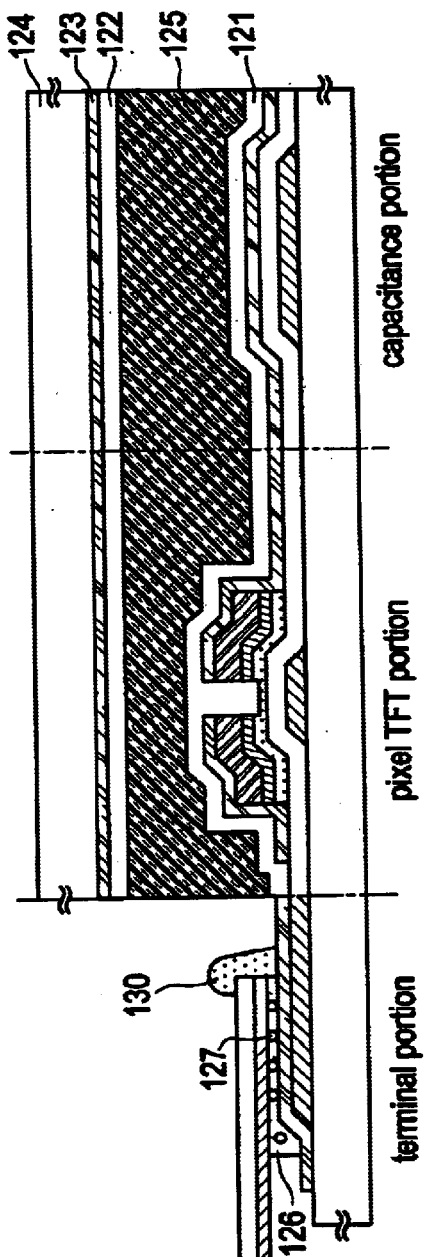
FIG. 3A
FIG. 3B
FIG. 3C

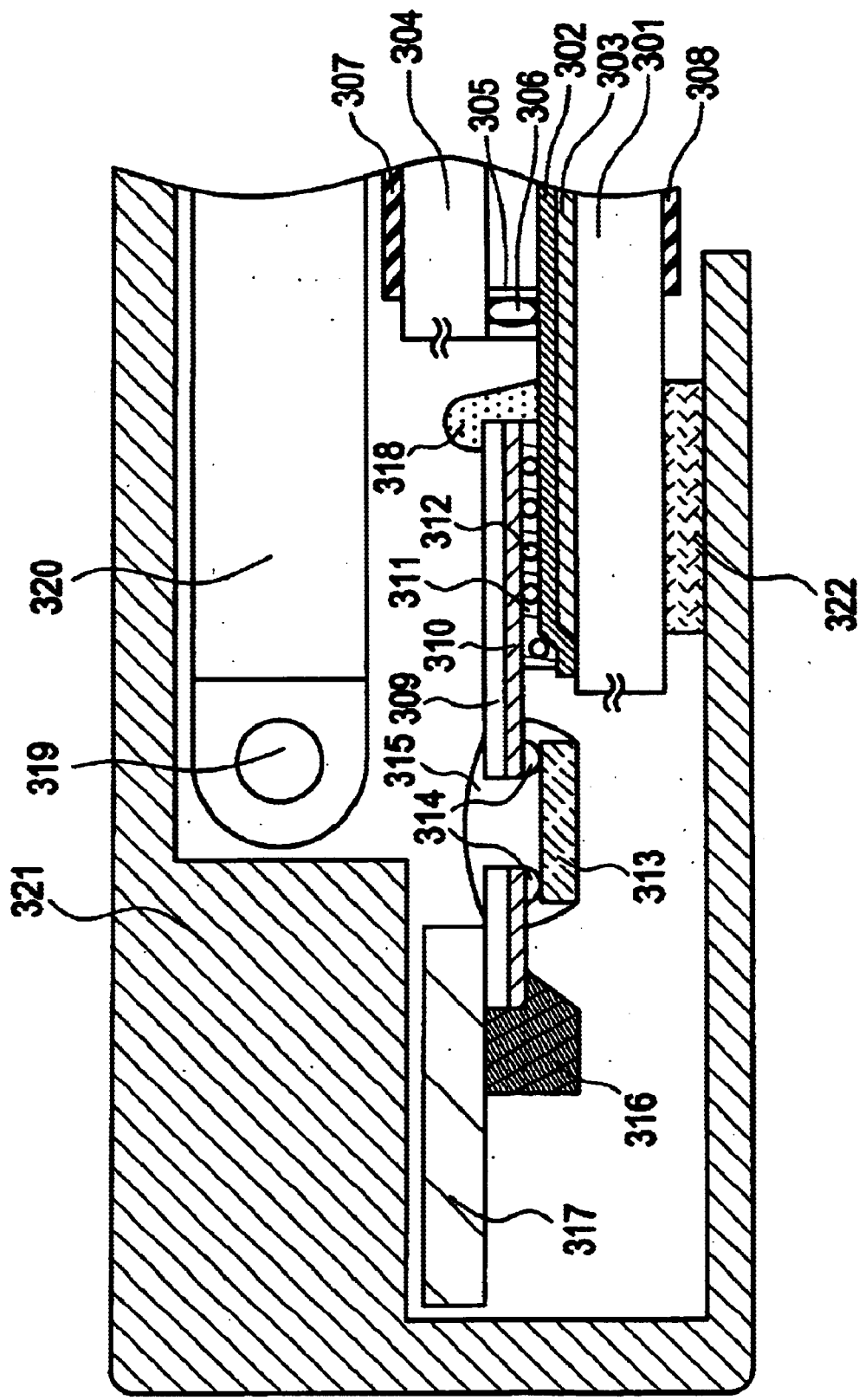

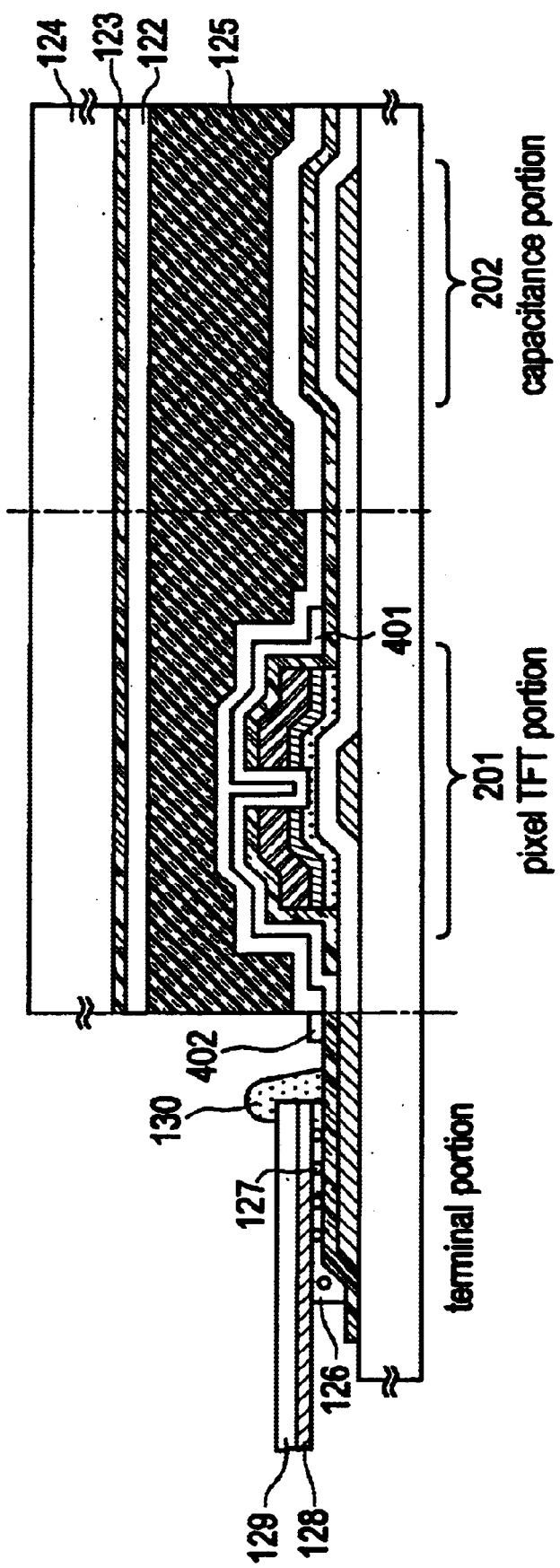

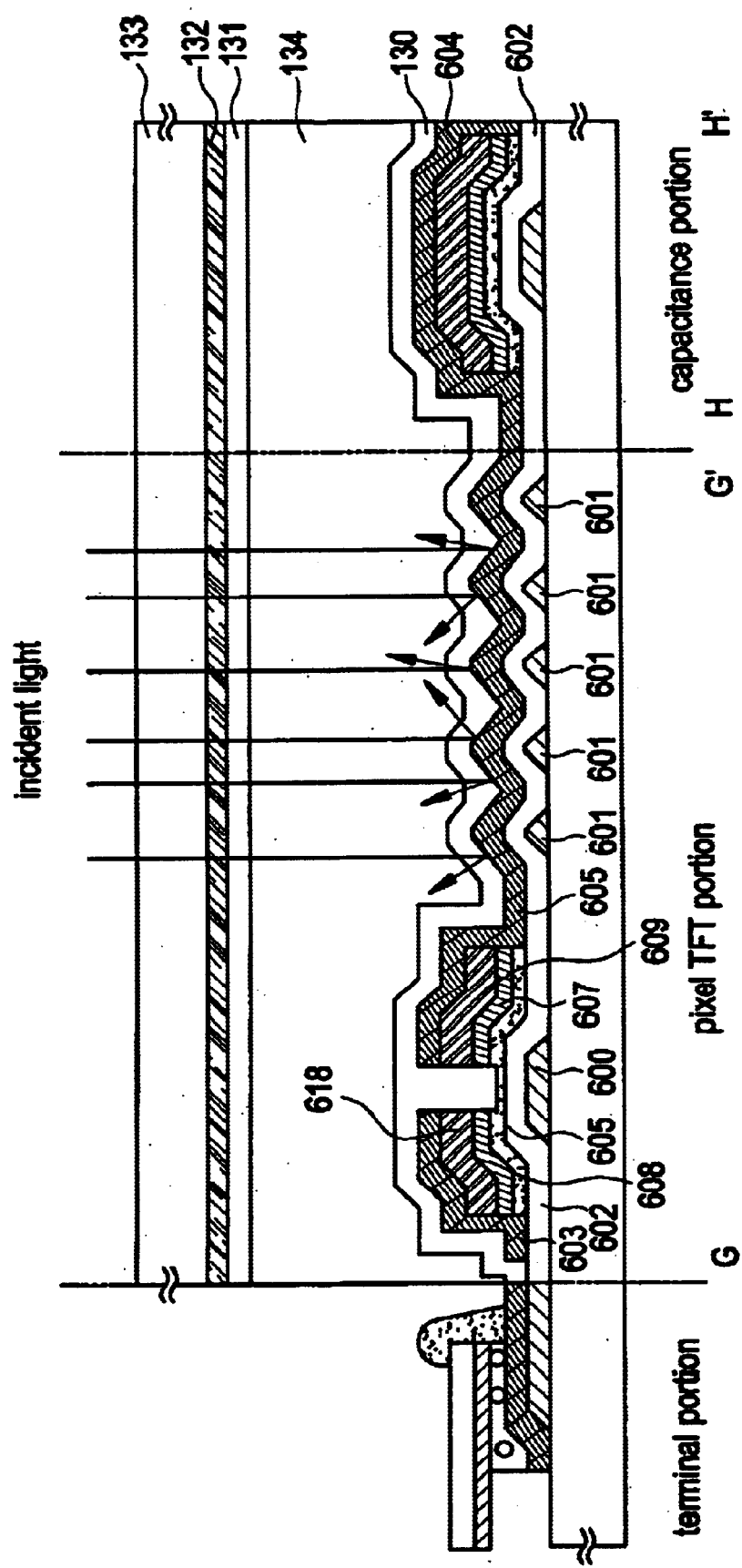

SEMICONDUCTOR DEVICE AND MANUFACTURING METHOD THEREOF

FIELD OF THE INVENTION

The present invention relates to a semiconductor device having a circuit comprised of a thin film transistor (hereafter referred to as TFT), and to a method of manufacturing thereof. For example, the present invention relates to an electro-optical device, typically a liquid crystal display panel, and to electronic appliance loaded with this type of electro-optical device as a part.

Note that, throughout this specification, semiconductor device denotes a general device which can function by utilizing semiconductor characteristics and all of electro-optical devices, semiconductor circuits, and electronic appliances are semiconductor devices.

DESCRIPTION OF THE RELATED ART

In recent years, techniques of structuring a thin film transistor (TFT) by using a semiconductor thin film (with a thickness on the order of several nm to several hundred of nm) formed over a substrate having an insulating surface have been in the spotlight. The thin film transistor is being widely applied in an electronic device such as an IC or an electro-optical device, and in particular, its development as a switching element of an image display device has been proceeding rapidly.

Conventionally, a liquid crystal display device is known as an image display device. Active matrix liquid crystal display devices have come into widespread due to the fact that, compared to passive liquid crystal display devices, a higher precision image can be obtained. By driving pixel electrodes arranged in a matrix state in the active matrix liquid crystal display device, a display pattern is formed on a screen. In more detail, by applying a voltage between a selected pixel electrode and an opposing electrode corresponding to the pixel electrode, optical modulation of a liquid crystal layer arranged between the pixel electrode and the opposing electrode is performed, and.the optical modulation is recognized as a display pattern by an observer.

The use of this type of active matrix liquid crystal display device is spreading, and along with making the screen size larger, demands for higher precision, higher aperture ratio, and higher reliability are increasing. Further, at the same time, demands are increasing for improving productivity and lowering costs.

Conventionally, an amorphous silicon film is ideally used as an amorphous semiconductor film because of the capability of forming it on a large surface area substrate at a low temperature equal to or less than 300° C. Further, a reverse stagger type (or bottom gate type) TFT having a channel forming region formed by an amorphous semiconductor film is often used.

SUMMARY OF THE INVENTION

Conventionally, the production costs have been high in order to manufacture a TFT on a substrate with a technique of photolithography using at least 5 photomasks for an active matrix type electro-optical device. In order to improve productivity and yield, reducing the number of steps is considered to be an effective means.

Specifically, it is necessary to reduce the number of photomasks needed to manufacture the TFT. The photomask is used in a photolithography technique in order to form a photoresist pattern, which becomes an etching process mask, on the substrate.

By using one photomask, there are applied with steps such as applying resist, pre-baking, exposure, development, and post-baking, and in addition, steps of film deposition and etching, resist peeling, cleaning, and drying are added before and after these steps. Therefore, the entire process becomes complex, which leads to a problem.

Further, static electricity is generated by causes such as friction during manufacturing steps because the substrate is an insulator. If static electricity is generated, then short circuits develop at an intersection portion of wirings formed on the substrate, and deterioration or breakage of the TFT due to static electricity leads to display faults or deterioration of image quality in electro-optical devices. In particular, static electricity develops during rubbing in the liquid crystal aligning process performed in the manufacturing steps, and this becomes a problem.

The present invention is for solving such problems, and an object of the present invention is to reduce the number of steps for manufacturing a TFT, and to realize a reduction in the production cost and an improvement in yield for an electro-optical display device typified by an active matrix type liquid crystal display device.

Further, an object of the present invention is to provide a structure and a method of manufacturing the structure for resolving the problems of damage to the TFT and deterioration of TFT characteristics due to static electricity.

In order to solve the above problems, the present invention is characterized by employing a channel etch type bottom gate TFT structure, and by performing patterning of a source region, a drain region, and a pixel electrode by using the same photomask.

A method of manufacturing of the present invention is simply explained below.

First, a gate wiring 102 is formed using a first mask (photomask number 1).

Next, an insulating film (gate insulating film) 104a, a first amorphous semiconductor film 105, a second amorphous semiconductor film 106 containing an impurity element which imparts n-type conductivity, and a first conductive film 107 are laminated in order. (See FIG. 2(A).) Note that a microcrystalline semiconductor film may be used as a substitute for the amorphous semiconductor film, and that a microcrystalline semiconductor film containing an impurity element which imparts n-type conductivity may be used as a substitute for the amorphous semiconductor film containing an impurity element which imparts n-type conductivity. In addition, these films (104a, 105, 106, and 107) can be formed in succession without exposure to the atmosphere in a plurality of chambers, or in the same chamber, using sputtering or plasma CVD. The mixing in of impurities can be prevented by having no exposure to the atmosphere.

Next, by using a second mask (photomask number 2): the above first conductive film 107 is patterned, forming a wiring (which later becomes a source region and an electrode (drain electrode)) 111 from the first conductive film; the above second amorphous semiconductor film 106 is patterned, forming a second amorphous semiconductor film 110 containing an impurity element which imparts n-type conductivity; and the above first amorphous semiconductor film 105 is patterned, forming a first amorphous semiconductor film 109. (See FIG. 2(B).)

A second conductive film 112 is formed next on the entire surface. (See FIG. 2(D).) Note that a transparent conductive film may be used as the second conductive film 112, and that a conductive film having reflective characteristics may also be used.

Next, by using a third mask (photomask number 3): the above second conductive film 112 is patterned, forming a pixel electrode 119 from the second conductive film; the above wiring is patterned, forming a source wiring 117 and an electrode (drain electrode) 118; the second amorphous semiconductor film 110 containing an impurity element which imparts n-type conductivity is patterned, forming a source region 115 and a drain region 116 from the second amorphous semiconductor film containing an impurity element which imparts n-type conductivity; and a portion of the above first amorphous semiconductor film 109 is removed, forming a first amorphous semiconductor film 114. (See FIG. 3(A).)

By using this type of constitution, the number of photomasks used in the photolithography technique can be set to 3 when manufacturing a pixel TFT portion.

Further, the source wiring is covered by a second conductive film 120 made from the same material as the pixel electrode, to form a structure which protects the entire substrate from external static electricity. Furthermore, a structure in which a protecting circuit is formed using the second conductive film 120 in a region other than the pixel TFT portion may also be used. The generation of static electricity due to friction between production apparatus and the insulating substrate can be prevented during manufacturing processing by using this type of structure. In particular, the TFTs can be protected from static electricity generated during a liquid crystal alignment process of rubbing performed during manufacturing steps.

A constitution of the present invention disclosed in this specification is:

a semiconductor device having a gate wiring, a source wiring, and a pixel electrode, comprising:
the gate wiring 102 formed on an insulating surface;
the insulating film 104b formed on the gate wiring;
the amorphous semiconductor film 114 formed on the insulating film;
the source region 115 and the drain region 116 formed on the amorphous semiconductor film;
the source wiring 117 or the electrode 118 formed on the source region or the drain region; and
the pixel electrode 119 formed on the electrode; characterized in that:
one end surface of the drain region 116 or the source region 115 roughly corresponds with an end surface of the amorphous semiconductor film 114 and an end surface of the electrode 118.

Further, another constitution of the present invention is:
a semiconductor device having a gate wiring, a source wiring, and a pixel electrode, comprising:
the gate wiring 102 formed on an insulating surface;
the insulating film 104b formed on the gate wiring;
the amorphous semiconductor film 114 formed on the insulating film;
the source region 115 and the drain region 116 formed on the amorphous semiconductor film;
the source wiring 117 or the electrode 118 formed on the source region or the drain region; and
the pixel electrode 119 formed on the electrode; characterized in that:
one end surface of the drain region 115 or the source region 116 roughly corresponds with an end surface of the amorphous semiconductor film 114 and an end surface of the electrode 118; and
another end surface of the drain region 115 or the source region 116 roughly corresponds with an end surface of the pixel electrode 119 and another end surface of the electrode 118.

Furthermore, another constitution of the present invention is:

a semiconductor device having a gate wiring, a source wiring, and a pixel electrode, comprising:
the gate wiring 102 formed on an insulating surface;
the insulating film 104b formed on the gate wiring;
the amorphous semiconductor film 114 formed on the insulating film;
the source region 115 and the drain region 116 formed on the amorphous semiconductor film;
the source wiring 117 or the electrode 118 formed on the source region or the drain region; and
the pixel electrode 119 formed on the electrode; characterized in that:
the amorphous semiconductor film and an amorphous semiconductor film containing an impurity element which imparts n-type conductivity are laminated under the source wiring 117.

Further, in the above constitutions, the semiconductor device becomes a transmission type liquid crystal display device when the pixel electrode 119 is a transparent conductive film, and becomes a reflection type liquid crystal display device when the pixel electrode 119 is a conductive film having reflective characteristics. In addition, the wiring 120 that comprises the same material as the pixel electrode is laminated on the source wiring.

Still further, it is characterized in that, in the present invention, formation of a convex portion 601, which gives the pixel electrode surface unevenness and gives light scattering characteristics, is performed using the same photomask as that of a gate wiring 600, in a method of manufacturing the reflection type liquid crystal display device. Note that the convex portion 601 is suitably formed on a region of the substrate other than the gate wiring and a TFT portion.

A method of manufacture of the present invention is explained in brief below.

First, the gate wiring 600 and the convex portion 601 are formed by using a first mask (photomask number 1).

Next, an insulating film (gate insulating film) 602, a first amorphous semiconductor film, a second amorphous semiconductor film containing an impurity element which imparts n-type conductivity, and a first conductive film are laminated in order. Note that a microcrystalline semiconductor film may be used as a substitute for the amorphous semiconductor film, and that a microcrystalline semiconductor film containing an impurity element which imparts n-type conductivity may be used as a substitute for the amorphous semiconductor film containing an impurity element which imparts n-type conductivity. In addition, these films can be formed in succession without exposure to the atmosphere in a plurality of chambers, or in the same chamber, using sputtering or plasma CVD. The mixing in of impurities can be prevented by having no exposure to the atmosphere.

The above insulating film 602 is formed on the substrate on which the convex portion 601 is formed and possesses an uneven surface.

Next, by using a second mask (photomask number 2): the above first conductive film is patterned, forming a wiring (which later becomes a source wiring and an electrode (drain electrode)) from the first conductive film; the above second amorphous semiconductor film is patterned, forming a second amorphous semiconductor film containing an impurity element which imparts n-type conductivity; and the above first amorphous semiconductor film is patterned, forming a first amorphous semiconductor film.

A second conductive film is formed next on the entire surface. Note that a conductive film having reflective characteristics is used as the second conductive film.

Next, by using a third mask (photomask number 3): the above second conductive film is patterned, forming a pixel electrode 604 from the second conductive film; the above wiring is patterned, forming a source wiring 618 and an electrode (drain electrode) 609; the second amorphous semiconductor film containing an impurity element which imparts n-type conductivity is patterned, forming a source region 608 and a drain region 607 from the second amorphous semiconductor film containing an impurity element which imparts n-type conductivity; and a portion of the above first amorphous semiconductor film is removed, forming a first amorphous semiconductor film 605.

By using such constitution, the number of photomasks used in the photolithography technique can be set to 3 when manufacturing a pixel TFT portion.

In addition, the surface of the insulating film formed on the convex portion 601 has unevenness, and the pixel electrode 604 is formed on the insulating film 602 possessing the uneven surface when using this type of constitution, and therefore the surface of the pixel electrode 604 can be given light scattering characteristics with the uneven surface.

A constitution of the present invention obtained in accordance with the above method of manufacturing is:

a semiconductor device having the gate wiring 600, the source wiring 618, and the pixel electrode 604 having reflective characteristics, comprising:

the gate wiring 600 and the convex portion 601 formed on an insulating surface;

the insulating film 602 having an uneven surface formed on the gate wiring and the convex portion;

the amorphous semiconductor film 605 formed on the insulating film 602;

the source region 608 and the drain region 607 formed on the amorphous semiconductor film;

the source wiring 618 or the electrode 609 formed on the source region or the drain region; and the pixel electrode 604 having an uneven surface and formed on the insulating film 602, which is formed on the electrode 609, having an uneven surface.

The above constitution is characterized in that the gate wiring 600 and the convex portion 601 are formed from the same material. Further, the above constitution is also characterized in that one end surface of the drain region 607 or the source region 608 roughly corresponds with an end surface of the amorphous semiconductor film 605 and an end surface of the electrode 609. In addition, the above constitution is also characterized in that one end surface of the drain region 607 or the source region 608 roughly corresponds with an end surface of the amorphous semiconductor film 605 and an end surface of the electrode 609, and another end surface of the drain region 607 or the source region 608 roughly corresponds with an end surface of the pixel electrode 604 and another end surface of the electrode 604.

Further, each of the above constitutions is characterized in that the source region and the drain region is made from an amorphous semiconductor film containing an impurity element which imparts n-type conductivity.

Still further, each of the above constitutions is characterized in that the insulating film, the amorphous semiconductor film, the source region, and the drain region are formed in succession without exposure to the atmosphere.

In addition, each of the above constitutions is characterized in that the insulating film, the amorphous semiconductor film, and the source region or the drain region are formed by sputtering.

Additionally, each of the above constitutions is characterized in that the source region and the drain region are formed by using the same mask as that of the amorphous semiconductor film and the electrode. Moreover, it is characterized in that the source region and the drain region are formed by using the same mask as that of the source wiring.

Further, each of the above constitutions is characterized in that the source region and the drain region are formed by using the same mask as that of the source wiring and the pixel electrode.

Furthermore, each of the above constitutions is characterized in that the pixel electrode contacts the insulating film. Moreover, the pixel electrode contacts an end surface of the drain region and an end surface of the amorphous semiconductor film.

In addition, a portion of the amorphous semiconductor film is removed in each of the above constitutions by etching using the third mask, and therefore this becomes a structure in which the film thickness of the amorphous semiconductor film in regions contacting the source region and the drain region is thicker than the film thickness in a region between the regions contacting the source region and the regions contacting the drain region, in short, a channel etch type bottom gate structure.

BRIEF DESCRIPTION OF THE DRAWINGS

FIG. 3 Cross-sectional views showing the process of manufacturing the active matrix substrate.

FIG. 7 A cross-sectional view showing an implemented structure of a liquid crystal display device.

FIG. 8 A cross-sectional view of a liquid crystal display device.

FIG. 14 A cross-sectional view of a reflecting type electro-optical device.

DETAILED DESCRIPTION OF THE INVENTION

Embodiment modes of the invention are explained below.

Figure 1:
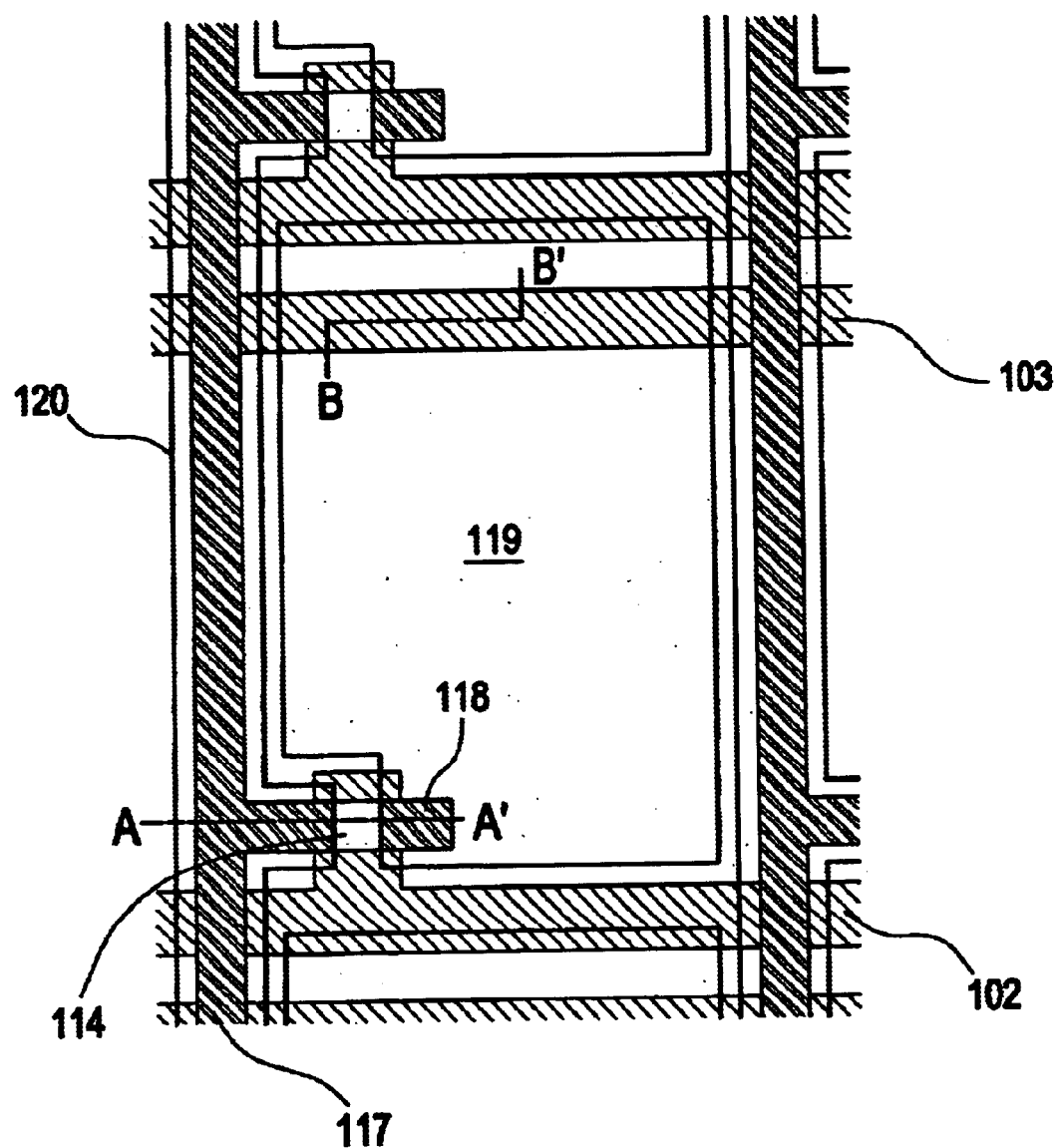
FIG. 1 A diagram showing a top view of the present invention.

FIG. 1 is one example of a planar view of an active matrix substrate of the present invention, and for the simplicity, the structure of one pixel out of the multiple number arranged in a matrix state is shown. FIGS. 2(A) to 3(C) are views showing a process of manufacturing of the active matrix substrate.

As shown in FIG. 1, the active matrix substrate has a plurality of gate wirings arranged parallel to each other, and a plurality of source wirings perpendicular to each of the gate wirings.

Further, a pixel electrode 119 is disposed in a region enclosed by the gate wirings and the source wirings. Further, a wiring 120 made from the same material as the pixel electrode overlaps a source wiring without overlapping the pixel electrode 119.

In addition, a capacitor wiring 103 is arranged parallel to the gate wiring 102, between two adjacent gate wirings under the pixel electrode 119. The capacitor wiring 103 is formed on all the pixels, and a capacitor is formed with an insulating film 104b as a dielectric, which exists between the capacitor wiring 103 and the pixel electrode 119.

Further, a TFT is disposed as a switching element in the vicinity of an intersection portion of a gate wiring 102 and the source wiring 117. This TFT is a reverse stagger type TFT (also referred to as a bottom gate type TFT) having a channel forming region formed from a semiconductor film having an amorphous structure (hereafter referred to as a first amorphous semiconductor film).

Further, the TFT is formed by a lamination of, in order on an insulating substrate, a gate electrode (formed integrally to the gate wiring 102), a gate insulating film, a first amorphous semiconductor film, a source region and a drain region made from a second amorphous semiconductor film, containing a impurity element which imparts n-type conductivity, a source electrode (formed as integrated with the source wiring 117) and an electrode 118 (hereafter referred to as a drain electrode).

Further, under the source wiring (including the source electrode) and the drain electrode 118, a gate insulating film, a first amorphous semiconductor film, and a second amorphous semiconductor film containing an impurity element which imparts n-type conductivity are laminated in order on the insulating substrate.

Further, the film thickness of a region between a region contacting the source region and a region contacting the drain region is thinner compared to other regions of the first amorphous semiconductor film. The reason that the film thickness becomes thin is that when forming the source region and the drain region by partitioning the second amorphous semiconductor film, which contains the impurity element for imparting n-type conductivity, by etching, a portion of the first amorphous semiconductor film is also removed. Further, an end surface of the pixel electrode, an end surface of the drain electrode, and an end surface of the drain region coincide by this etching process.

Furthermore, an end surface of the wiring 120, which covers the source electrode, the end surface of the source region, and the end surface of the source wiring coincide.

An explanation of the present invention having the above structure is performed in more detail by the embodiments shown below.

An embodiment of the invention are explained using FIGS. 1 to 6. Embodiment 1 shows a method of manufacturing a liquid crystal display device, and a detailed explanation of a method of forming a TFT of a pixel portion on a substrate by a reverse stagger type TFT, and manufacturing a storage capacitor connected to the TFT, is made in accordance with the processes used. Further, a manufacturing process for a terminal section, formed in an edge portion of the substrate, and for electrically connecting to wirings of circuits formed on other substrates, is shown at the same time in the same figures.

Figure 2A:
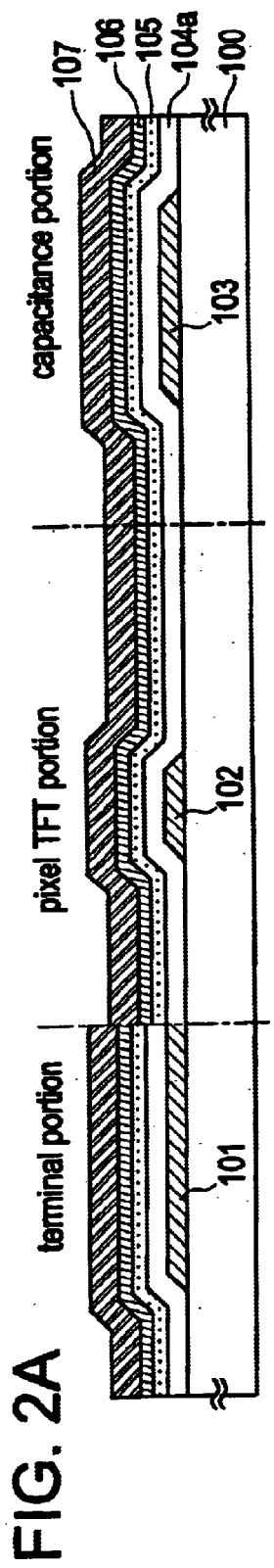
FIG. 2 Cross-sectional views showing a process of manufacturing an active matrix substrate.
Figure 2B:
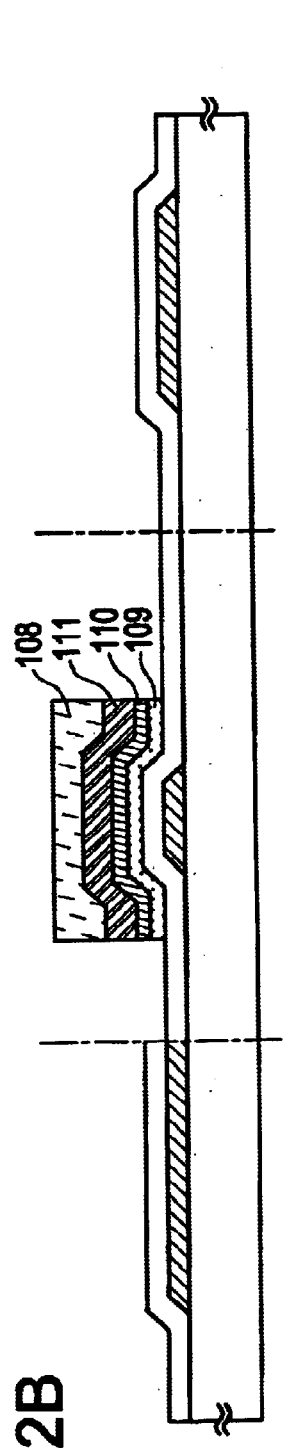
Figure 2C:
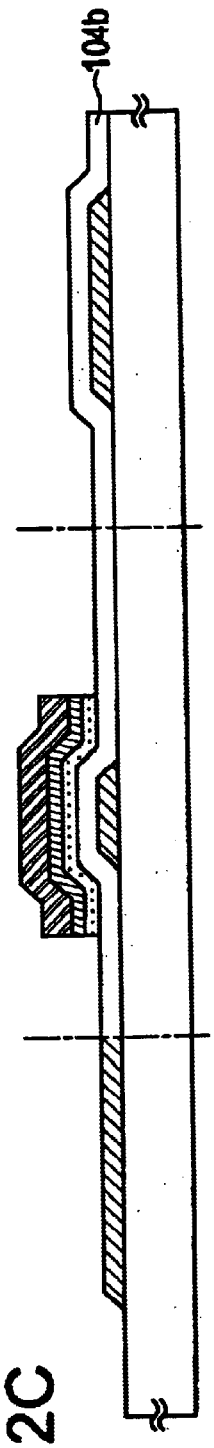
Figure 2D:
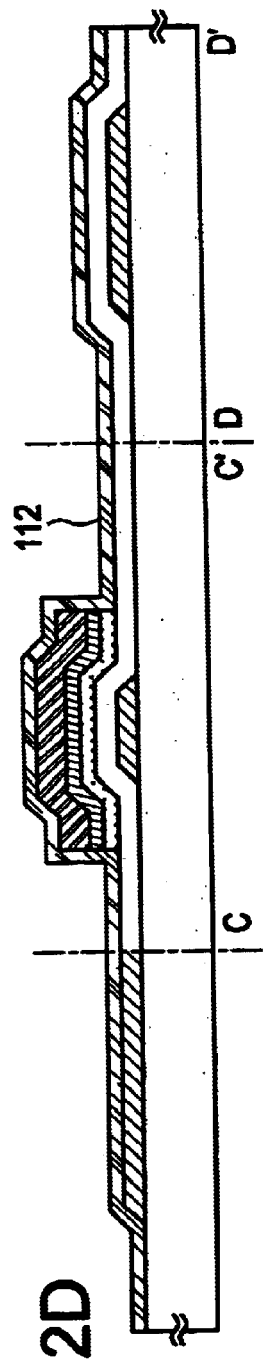

In FIG. 2(A), a glass substrate, comprising such as barium borosilicate glass or aluminum borosilicate glass, typically Corning Corp. #7059 or #1737, can be used as a substrate 100 having translucency. In addition, a translucent substrate such as a quartz substrate or a plastic substrate can also be used.

Figure 4A:
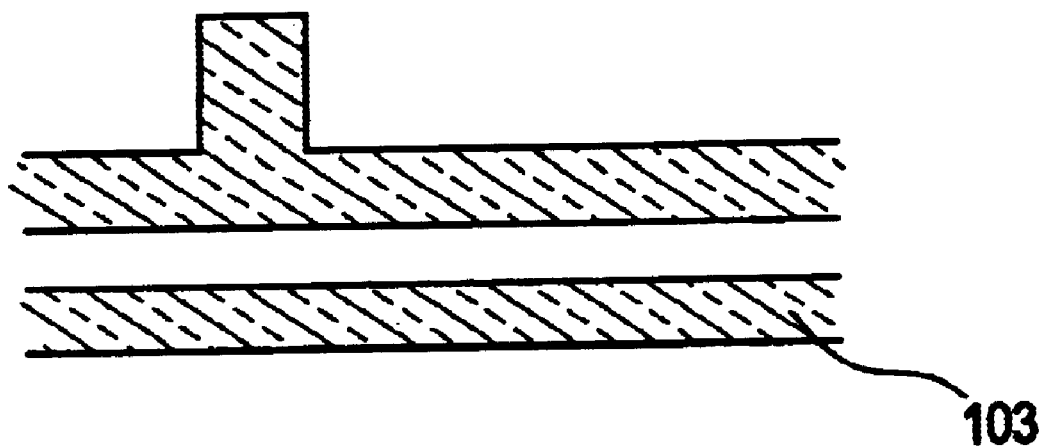
FIG. 4 A top view showing the process of manufacturing the active matrix substrate.
Figure 4B:
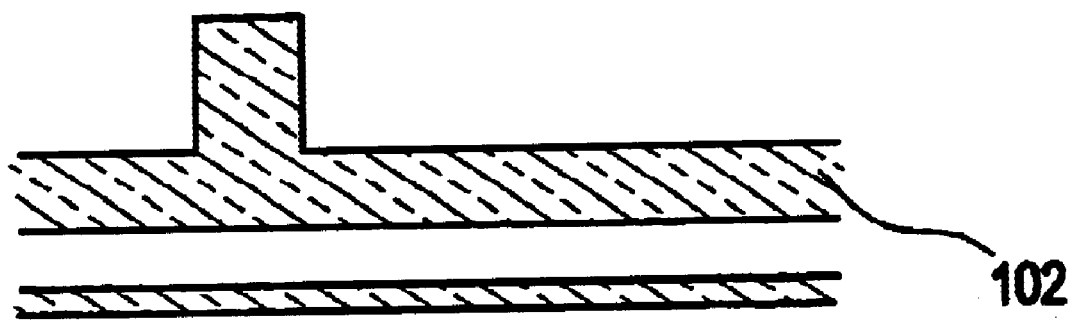

Next, after forming a conductive layer on the entire surface of the substrate, a first photolithography process is performed, a resist mask is formed, unnecessary portions are removed by etching, and wirings and electrodes (the gate wiring 102 including a gate electrode, a capacitor wiring 103 and a terminal 101) are formed. Etching is performed at this time to form a tapered portion in at least an edge portion of the gate electrode 102. A top view of this stage is shown in FIG. 4.

It is preferable to form the gate wiring 102 including the gate electrode, the capacitor wiring 103, and the edge portion terminal 101 from a low resistivity conductive material such as aluminum (Al) or copper (Cu), but simple Al has problems such as inferior heat resistance and easily corrodes, and therefore it is combined with a heat resistant conductive material. Further, an Ag—Pd—Cu alloy may also be used as the low resistance conductive material. One element selected from the group consisting of titanium (Ti), tantalum (Ta), tungsten (W), molybdenum (Mo), chromium (Cr), or an alloy having the above elements as its main constituent, or an alloy film of a combination of the above elements, or a nitrated compound having the above elements as its main constituent is formed as the heat resistant conductive material. For example, a lamination film of Ti and Cu, and a lamination film of TaN and Cu can be given. Furthermore, forming in combination with a heat resistant conductive material such as Ti, Si, Cr, or Nd, it is preferable because of improved levelness. Further, only such heat resistant conductive film may also be formed, for example, in combination with Mo and W.

In realizing the liquid crystal display device, it is preferable to form the gate electrode and the gate wiring by a combination of a heat resistant conductive material and a low electrical resistance conductive material. An appropriate combination in this case is explained.

Provided that the screen size is on the order of, or less than, 5 inch diagonal type, a two layer structure of a lamination of a conductive layer (A) made from a nitride compound of a heat resistant conductive material, and a conductive layer (B) made from a heat resistant conductive material is used. The conductive layer (B) may be formed from an element selected from the group consisting of Al, Cu, Ta, Ti, W, Nd, and Cr, or from an alloy of the above elements, or from an alloy film of a combination of the above elements, and the conductive layer (A) is formed from a film such as a tantalum nitride (TaN) film, a tungsten nitride (WN) film, or a titanium nitride (TiN) film. For example, it is preferable to use a double layer structure of a lamination of Cr as the conductive layer (A) and Al containing Nd as the conductive layer (B). The conductive layer (A) is given a thickness of 10 to 100 nm (preferably between 20 and 50 nm), and the conductive layer (B) is made with a thickness of 200 to 400 nm (preferably between 250 and 350 nm).

On the other hand, in order to be applied to a large screen, it is preferable to use a three layer structure of a lamination of a conductive layer (A) made from a heat resistant conductive material, a conductive layer (B) made from a low electrical resistance conductive material, and a conductive layer (C) made from a heat resistant conductive material. The conductive layer (B) made from the low electrical resistance conductive material is formed from a material comprising aluminum (Al), and in addition to pure Al, Al containing between 0.01 and 5 atomic % of an element such as scandium (Sc), Ti, Nd, or silicon (Si) is used. The conductive layer (C) is effective in preventing generation of hillocks in the Al of the conductive layer (B). The conductive layer (A) is given a thickness of 10 to 100 nm (preferably between 20 and 50 nm), the conductive layer (B) is made from 200 to 400 nm thick (preferable between 250 and 350 nm), and the conductive layer. (C) is from 10 to 100 nm thick (preferably between 20 and 50 nm). In Embodiment 1, the conductive layer (A) is formed from a Ti film with a thickness of 50 nm, made by sputtering with a Ti target, the conductive layer (B) is formed from an Al film with a thickness of 200 nm, made by sputtering with an Al target, and the conductive layer (C) is formed from a 50 nm thick Ti film, made by sputtering with a Ti target.

An insulating film 104a is formed next on the entire surface. The insulating film 104a is formed using sputtering, and has a film thickness of 50 to 200 nm.

For example, a silicon nitride film is used as the insulating film 104a, and formed to a thickness of 150 nm. Of course, the gate insulating film is not limited to this type of silicon nitride film, and another insulating film such as a silicon oxide film, a silicon oxynitride film, or a tantalum oxide film may also be used, and the gate insulating film may be formed from a single layer or a lamination structure made from these materials. For example, a lamination structure having a silicon nitride film as a lower layer and a silicon oxide film as an upper layer may be used.

Next, a first amorphous semiconductor film 105 is formed with a thickness of 50 to 200 nm (preferably between 100 and 150 nm) on the insulating film 104a over the entire surface by using a known method such as plasma CVD or sputtering (not shown in the figure). For example, an amorphous silicon (a-Si) film is formed with a thickness of 100 nm by sputtering using a silicon target. In addition, it is also possible to apply a microcrystalline semiconductor film, or a compound semiconductor film having an amorphous structure, such as an amorphous silicon germanium film ($Si_xGe_{(1-x)}$, where 0<x<1), or an amorphous silicon carbide ($Si_xC_y$).

A second amorphous semiconductor film which contains an impurity element imparting one conductivity type (n-type or p-type) is formed next with a thickness of 20 to 80 nm. The second amorphous semiconductor film which contains an impurity element imparting one conductivity type (n-type or p-type) is formed on the entire surface by a known method such as plasma CVD or sputtering. In Embodiment 1, second amorphous semiconductor film 106, containing an n-type impurity element, is formed using a silicon target in which phosphorous (P) has been added. Alternatively, film deposition may be performed by sputtering using a silicon target in an atmosphere containing phosphorous. In addition, the second amorphous semiconductor film, containing an n-type impurity element may also be formed from a hydrogenated microcrystalline silicon film ($\mu$c-Si:H).

Next, a first conductive film 107 made from a metallic material is formed by sputtering or vacuum evaporation. Provided that ohmic contact with the second amorphous semiconductor film 106 can be made, there are no particular limitation on the material of the first semiconductor film 107, and an element selected from the group consisting of Al, Cr, Ta, and Ti, or an alloy comprising the above elements, and an alloy film of a combination of the above elements or the like can be given. Sputtering is used in Embodiment 1, and a 50 to 150 nm thick Ti film, an aluminum (Al) film with a thickness between 300 and 400 nm above the Ti film, and a Ti film with a thickness of 100 to 150 nm thereon are formed as the first conductive film 107. (See FIG. 2(A).)

The insulating film 104a, the first amorphous semiconductor film 105, the second amorphous semiconductor film 106 containing an impurity element which imparts n-type conductivity, and the first conductive film 107 are all manufactured by a known method, and can be manufactured by plasma CVD or sputtering. These films (104a, 105, 106, and 107) are formed in succession by sputtering, and suitably changing the target or the sputtering gas in Embodiment 1. The same reaction chamber, or a plurality of reaction chambers, in the sputtering apparatus is used at this time, and it is preferable to laminate these films in succession without exposure to the atmosphere. By thus not exposing the films to the atmosphere, the mixing in of impurities can be prevented.

Next, a second photolithography process is then performed, a resist mask 108 is formed, and by removing unnecessary portions by etching, a wiring (becoming a source wiring and a drain electrode by subsequent processing) 111 is formed. Wet etching or dry etching is used as the etching process at this time. The first conductive film 107, the second amorphous semiconductor film 106 containing an impurity element which imparts n-type conductivity, and the first amorphous semiconductor film 105 are etched in order with the resist mask 108 as a mask. The wiring 111 composed of the first conductive film, a second amorphous conductive film 110 containing an impurity element which imparts n-type conductivity, and a first amorphous semiconductor film 109 are each formed in the pixel TFT portion. In Embodiment 1, the first conductive film 107 in which the Ti film, the Al film, and the Ti film are laminated in order is etched by dry etching using a gas mixture of $SiCl_4$, $Cl_2$, and $BCl_3$ as a reaction gas, and the reaction gas is substituted with a gas mixture of $CF_4$ and $O_2$, and the first amorphous semiconductor film 105 and the second amorphous semiconductor film 106, containing the impurity element for imparting n-type conductivity, are selectively removed. (See FIG. 2(B).) Further, the capacitor wiring 103 and the insulating film 104a remain in a capacitor portion, and the terminal 101 and the insulating film 104a also remain similarly in a terminal portion.

Next, after removing the resist mask 108, a resist mask is formed using a shadow mask, and the insulating film 104a covering the pad portion of the terminal portion is selectively removed, forming an insulating film 104b, after which the resist mask is removed. (See FIG. 2(C).) Further, as a substitute for the shadow mask, a resist mask may also be formed by screen printing as an etching mask.

Figure 5:
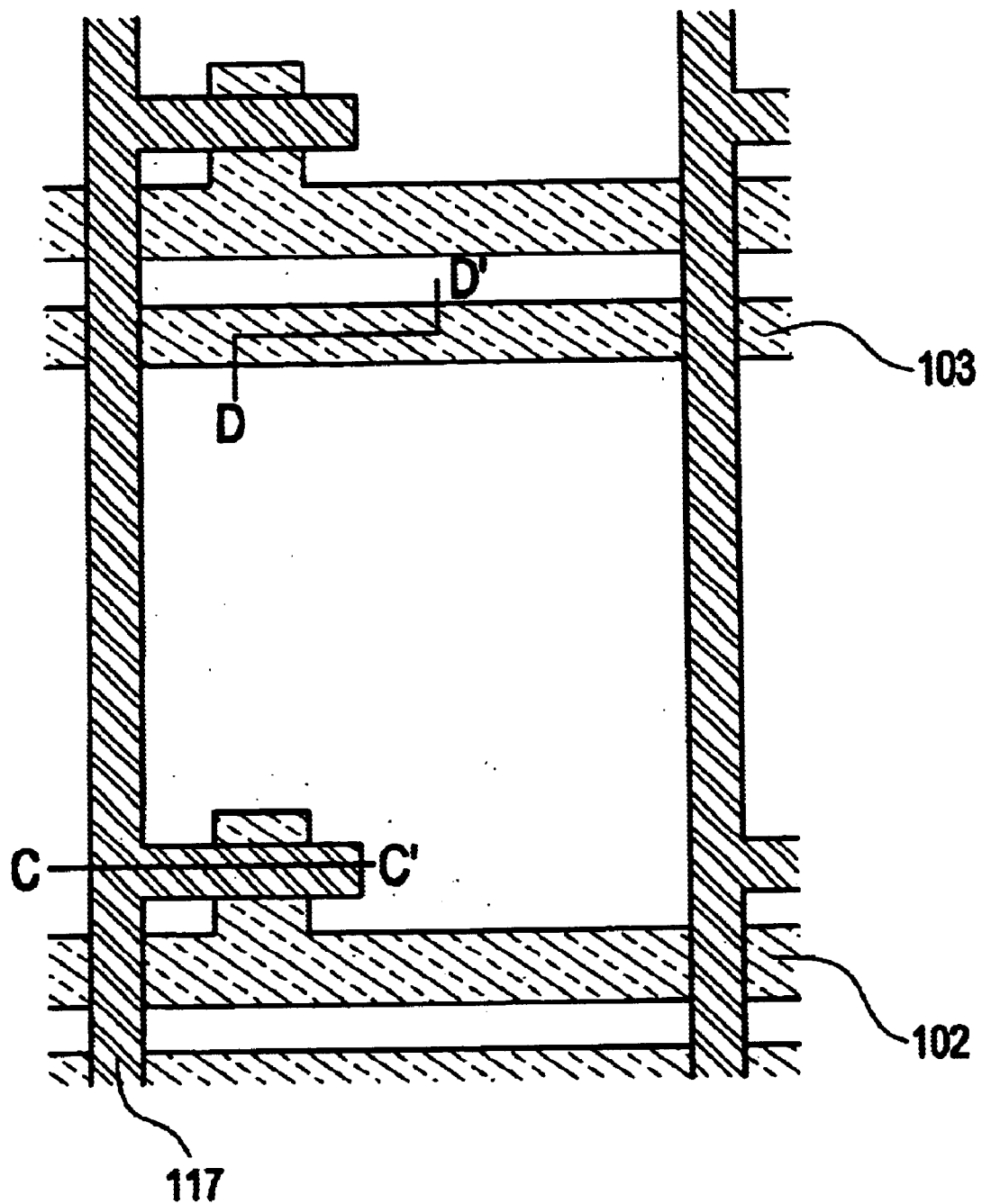
FIG. 5 A top view showing the process of manufacturing the active matrix substrate.

A second conductive film 112 is deposited next on the entire surface from a transparent conductive film. (See FIG. 2(D).) Further, a top view at this point is shown in FIG. 5. Note that, for simplification, the second conductive film 112 formed on the entire surface is not shown in FIG. 5.

The second conductive film 112 is formed from a material such as indium oxide ($In_2O_3$) or indium oxide tin oxide alloy ($In_2O_3$—$SnO_2$, abbreviated as ITO) using a method such as sputtering or vacuum evaporation. The etching process for this type of material is performed using a solution of hydrochloric acid type. However, a residue is easily generated, particularly by ITO etching, and therefore an indium oxide zinc oxide alloy ($In_2O_3$—ZnO) may be used in order to improve the etching workability. The indium oxide zinc oxide alloy has superior surface smoothing characteristics, and has superior thermal stability compared to ITO, and therefore even if the wiring 111 contacting the second conductive film 112 is made from an Al film, a corrosion reaction can be prevented. Similarly, zinc oxide (ZnO) is also a suitable material, and in addition, in order to increase the transmittivity of visible light and increase the conductivity, a material such as zinc oxide in which gallium (Ga) is added (ZnO:Ga) can be used.

Resist masks 113a to 113c are formed next by a third photolithography process. Unnecessary portions are then removed by etching, forming a first amorphous semiconductor film 114, a source region 115, a drain region 116, the source electrode 117, the drain electrode 118, and the pixel electrode 119. (See FIG. 3(A).)

The third photolithography process patterns the second conductive film 112, and at the same time removes a part of the wiring 111, the second amorphous semiconductor film 110 containing an impurity element which imparts n-type conductivity and the first amorphous semiconductor film 109 by etching, forming an opening. In Embodiment 1, the second conductive film 112 made from ITO is selectively removed first by wet etching using a mixed solution of nitric acid and hydrochloric acid, or a ferric chloride solution, and after selectively removing the wiring 111 by wet etching, the second amorphous semiconductor film 110, containing the impurity element which imparts n-type conductivity, and a portion of the amorphous semiconductor film 109 are etched by dry etching. Note that wet etching and dry etching are used in Embodiment 1, but the operator may perform only dry etching by suitably selecting the reaction gas, and the operator may perform only wet etching by suitably selecting the reaction solution.

Further, the lower portion of the opening reaches the first amorphous semiconductor film, and the first amorphous semiconductor film 114 is formed having a concave portion. The wiring 111 is separated into the source wiring 117 and the drain electrode 118 by the opening, and the second amorphous semiconductor film 110, containing an impurity element which imparts n-type conductivity is separated into the source region 115 and the drain region 116. Furthermore, the second conductive film 120 contacting the source wiring covers the source wiring, and during subsequent manufacturing processes, especially during a rubbing process, fulfills a role of preventing static electricity from developing. An example of forming the second conductive film 120 on the source wiring is shown in Embodiment 1, but the second conductive film 120 may also be removed.

Moreover, a storage capacitor is formed in the third photolithography process by the capacitor wiring 103 and the pixel electrode 119, with the insulating film 104b in the capacitor portion as a dielectric.

In addition, the second conductive film made from the transparent conductive film formed in the terminal portion and covered by the resist mask 113c remains after the third photolithography process.

The resist masks 113a to 113c are removed next. A cross section diagram of this state is shown in FIG. 3(B). Note that FIG. 1 is a top view of one pixel, and FIG. 3B corresponds to cross sections taken along the lines A–A' and B–B'.

Figure 9A:
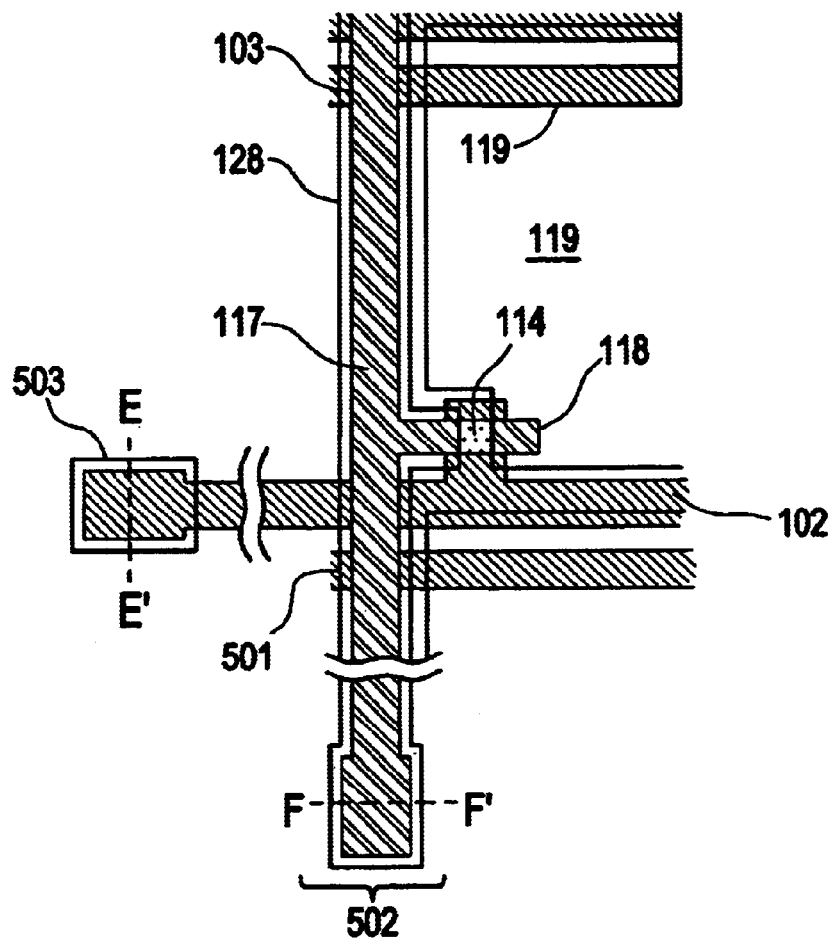
FIG. 9 A top view and a cross-sectional view of an input terminal portion.
Figure 9B:
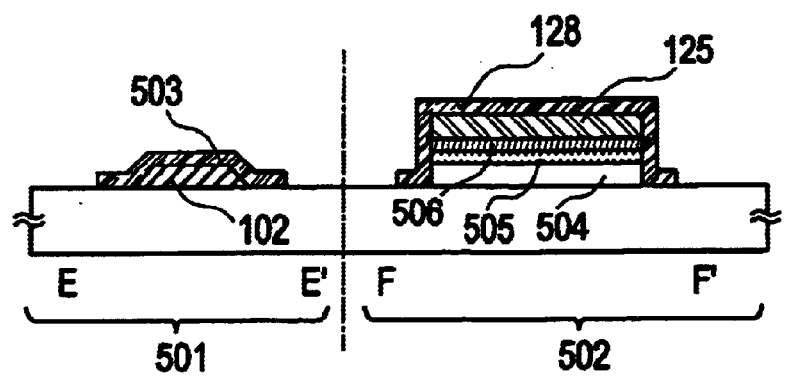

Furthermore, FIG. 9A shows top views of a gate wiring terminal portion 501 and a source wiring terminal portion 502 in this state. Note that the same symbols are used for area corresponding to those of FIG. 1 to FIG. 3. Further, FIG. 9(B) corresponds to a cross-sectional view taken along the lines E–E' and F–F' in FIG. 9(A). Reference numeral 503 in FIG. 9(A) denotes a connecting electrode made from a transparent conductive film and functioning as an input terminal. In addition, in FIG. 9(B) reference numeral 504 denotes an insulating film (extended from 104b), reference numeral 505 denotes a first amorphous semiconductor film (extended from 114), and reference numeral 506 denotes a second amorphous semiconductor film containing an impurity element which imparts n-type conductivity (extended from 115).

By thus using three photomasks and performing three photolithography processes, the pixel TFT portion having the reverse stagger type n-channel type TFT 201 and the storage capacitor 202 can be completed. By placing these in a matrix state corresponding to each pixel and thus composing the pixel portion, one substrate can be made in order to manufacture an active matrix type electro-optical device. For convenience, this type of substrate is referred to as an active matrix substrate throughout this specification.

An alignment film 121 is selectively formed next in only the pixel portion of the active matrix substrate. Screen printing may be used as a method of selectively forming the alignment film 121, and a method of removal in which a resist mask is formed using a shadow mask after application of the alignment film may also be used. Normally, a polyimide resin is often used in the alignment film of the liquid crystal display element.

Next, a rubbing process is then performed on the alignment film 121, orienting the liquid crystal elements so as to possess a certain fixed pre-tilt angle.

The active matrix substrate, and an opposing substrate 124 on which an opposing electrode 122, and an alignment film 123 are formed are next joined together by a sealant while maintaining a gap between the substrates using spacers, after which a liquid crystal material 125 is injected into the space between the active matrix substrate and the opposing substrate. A known material may be applied for the liquid crystal material 125, and a TN liquid crystal is typically used. After injecting the liquid crystal material, the injecting entrance is sealed by a resin material.

Next, a flexible printed circuit (FPC) is connected to the input terminal 101 of the terminal portion. The FPC is formed by a copper wiring 128 on an organic resin film 129 such as polyimide, and is connected to the transparent conductive film covering the input terminal by an anisotropic conductive adhesive. The anisotropic conductive adhesive comprises an adhesive 126 and particles 127, with a diameter of several tens to several hundred of $\mu$m and having a conductive surface plated by a material such as gold, which are mixed therein. The particles 127 form an electrical connection in this portion by connecting the transparent conductive film on the input terminal 101 and the copper wiring 128. In addition, in order to increase the mechanical strength of this region, a resin layer 130 is formed. (See FIG. 3(C).)

Figure 6:
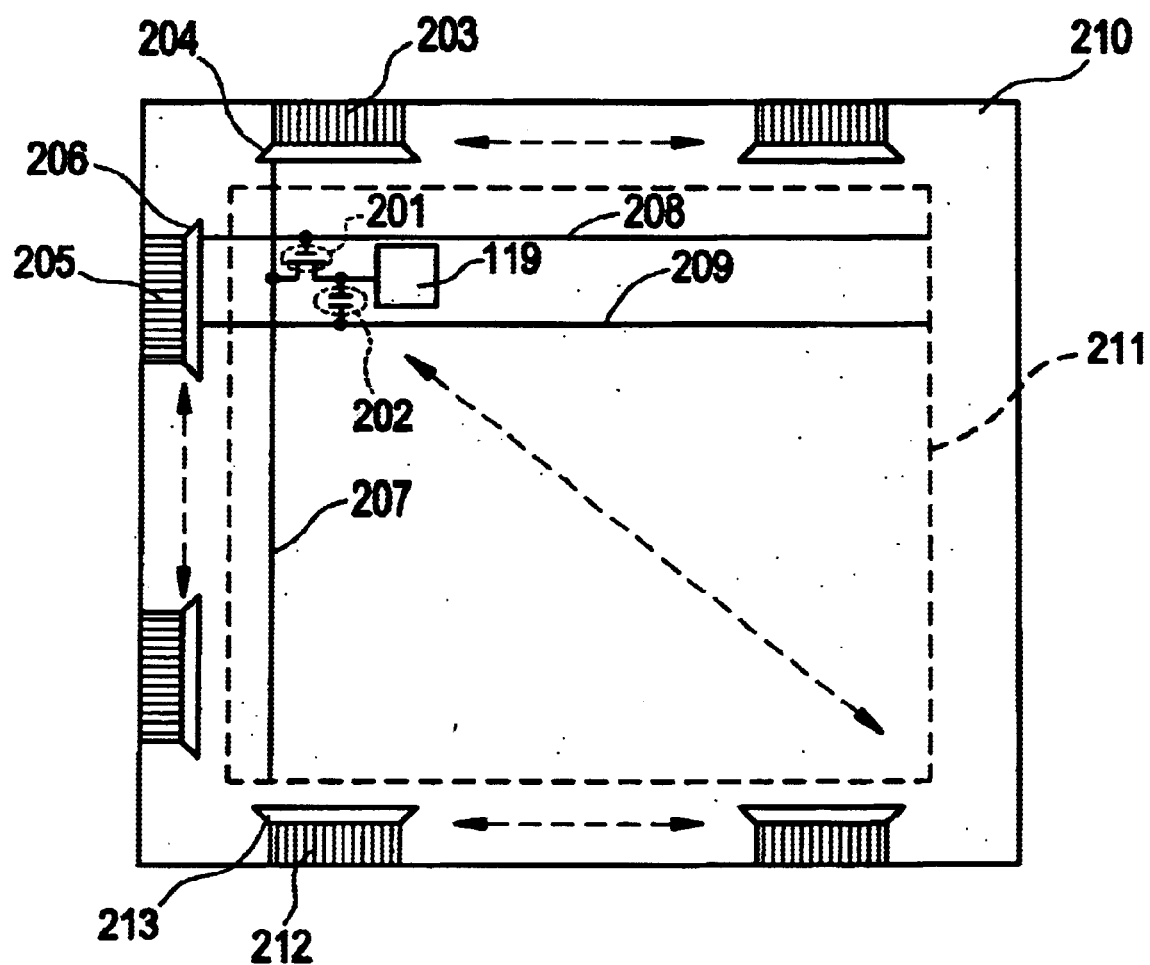
FIG. 6 A top view for explaining the arrangement of a pixel portion and an input terminal portion of a liquid crystal display device.

FIG. 6 is a diagram explaining the placement of the pixel portion and the terminal portion of the active matrix substrate. A pixel portion 211 is formed on a substrate 210, gate wirings 208 and source wirings 207 are formed intersecting on the pixel portion, and the n-channel TFT 201 connected to this is formed corresponding to each pixel. The pixel electrode 119 and a storage capacitor 202 are connected to the drain side of the n-channel TFT 201, and the other terminal of the storage capacitor 202 is connected to a capacitor wiring 209. The structure of the n-channel TFT 201 and the storage capacitor 202 is the same as that of the n-channel TFT 201 and the storage capacitor 202 shown by FIG. 3B.

An input terminal portion 205 for inputting a scanning signal is formed in one edge portion of the substrate, and is connected to a gate wiring 208 by a connection wiring 206. Further, an input terminal portion 203 for inputting an image signal is formed in the other edge portion, and is connected to a source wiring 207 by a connection wiring 204. A plurality of the gate wiring 208, the source wiring 207, and the capacitor wiring 209 are formed in accordance with the pixel density. Furthermore, an input terminal portion 212 for inputting an image signal and a connection wiring 213 may be formed, and may be connected to the source wiring alternately with the input terminal portion 203. An arbitrary number of the input terminal portions 203, 205, and 212 are formed, which may be suitably determined by the operator.

FIG. 7 is an example of a method of mounting a liquid crystal display device. The liquid crystal display device has an input terminal portion 302 formed in an edge portion of a substrate 301 on which TFTs are formed, and as shown by embodiment 1, this is formed by a terminal 303 formed from the same material as a gate wiring. An opposing substrate 304 is joined to the substrate 301 by a sealant 305 encapsulating spacers 306, and in addition, polarizing plates 307 and 308 are formed. This is then fixed to a casing 321 by spacers 322.

Note that the TFT obtained in Embodiment 1 having an active layer formed by an amorphous semiconductor film has a low electric field effect mobility, and only approximately 1 cm$^2$/Vsec is obtained. Therefore, a driver circuit for performing image display is formed by an IC chip and mounted by a TAB (tape automated bonding) method or by a COG (chip on glass) method. In Embodiment 2, an example is shown of forming the driver circuit in an IC chip 313, and mounting by using the TAB method. A flexible printed circuit (FPC) is used, and the FPC is formed by a copper wiring 310 on an organic resin film 309, such as polyimide, and is connected to the input terminal 302 by an anisotropic conductive adhesive. The input terminal is a transparent conductive film formed on and contacting the wiring 303. The anisotropic conductive adhesive is structured by an adhesive 311 and particles 312, with a diameter of several tens to several hundred of $\mu$m and having a conductive surface plated by a material such as gold, which are mixed therein. The particles 312 form an electrical connection in this portion by connecting the input terminal 302 and the copper wiring 310. In addition, in order to increase the mechanical strength of this region, a resin layer 318 is formed.

The IC chip 313 is connected to the copper wiring 310 by a bump 314, and is sealed by a resin material 315. The copper wiring 310 is then connected to a printed substrate 317 on which other circuits such as a signal processing circuit, an amplifying circuit, and a power supply circuit are formed, through a connecting terminal 316. A light source 319 and a light conductor 320 are formed on the opposing substrate 304 and used as a back light in the transmitting liquid crystal display device.

In Embodiment 3, an example of forming a protecting film is shown in FIG. 6. Note that Embodiment 3 is identical to Embodiment 1 through the state of FIG. 3(B), and therefore only points of difference are explained. Further, the same symbols are used for locations corresponding to those in FIG. 3(B).

After first forming through the state of FIG. 3(B) in accordance with Embodiment 1, a thin inorganic insulating film is formed on the entire surface. An inorganic insulating film formed by using plasma CVD or sputtering such as a silicon oxide film, a silicon nitride film, a silicon oxynitride film, or a tantalum oxide film is used as the thin inorganic insulating film, and a single layer or a lamination structure made from these materials may be formed.

A forth photolithography process is performed next, forming a resist mask, and unnecessary portions are removed by etching, forming an insulating film 402 in the pixel TFT portion, and an inorganic insulating film 401 in the terminal portion. These inorganic insulating films 401 and 402 function as passivation films. Further, the thin inorganic insulating film 401 is removed in the terminal portion by the fourth photolithography process, exposing the second conductive film, made from the transparent conductive film, formed on the terminal 101 of the terminal portion.

The reverse stagger type n-channel type TFT and the storage capacitor, protected by the inorganic insulating film, can thus be completed in Embodiment 3 by performing the photolithography process using four photomasks four times in total. By thus structuring the pixel portion by arranging these into a matrix state corresponding to each pixel, one substrate for manufacturing the active matrix electro-optical device can be made.

Note that it is possible to freely combine the constitution of Embodiment 3 with that of Embodiment 1 or Embodiment 2.

In Embodiment 1 an example centering on forming an insulating film, a first amorphous semiconductor film, a second amorphous semiconductor film, containing an impurity element which imparts n-type conductivity, and a first conductive film by sputtering, but Embodiment 4 shows an example of using plasma CVD to form the films.

The insulating film, the first amorphous semiconductor film, and the second amorphous semiconductor film, containing an impurity element which imparts n-type conductivity are formed by plasma CVD.

In Embodiment 4, a silicon oxynitride film is used as the insulating film, and formed with a thickness of 150 nm by plasma CVD. Plasma CVD may be performed at this point with a power supply frequency of 13 to 70 MHz, preferably between 27 and 60 MHz. By using a power supply frequency of 27 to 60 MHz, a dense insulating film can be formed, and the voltage resistance can be increased as a gate insulating film. Further, a silicon oxynitride film manufactured by adding $N_2O$ to $SiH_4$ and $NH_3$ has a reduction in fixed electric charge density, and therefore is a material which is preferable for this use. Of course, the gate insulating film is not limited to this type of silicon oxynitride film, and a single layer or a lamination structure using other insulating films such as s silicon oxide film, a silicon nitride film, or a tantalum oxide film may be formed. Further, a lamination structure of a silicon nitride film in a lower layer, and a silicon oxide film in an upper layer may be used.

For example, when using a silicon oxide film, it can be formed by plasma CVD using a mixture of tetraethyl orthosilicate (TEOS) and $O_2$, with the reaction pressure set to 40 Pa, a substrate temperature of 250 to 350° C., and discharge at a high frequency (13.56 MHz) power density of 0.5 to 0.8 W/cm$^2$. Good characteristics as the gate insulating film can be obtained for the silicon oxide film thus formed by a subsequent thermal anneal at 300 to 400° C.

Typically, a hydrogenated amorphous silicon (a-Si:H) film is formed with a thickness of 100 nm by plasma CVD as the first amorphous semiconductor film. At this point, plasma CVD may be performed with a power supply frequency of 13 to 70 MHz, preferably between 27 and 60 MHz, in the plasma CVD apparatus. By using a power frequency of 27 to 60 MHz, it becomes possible to increase the film deposition speed, and the deposited film is preferable because it becomes an a-Si film having a low defect density. In addition, it is also possible to apply a microcrystalline semiconductor film and a compound semiconductor film having an amorphous structure, such as an amorphous silicon germanium film, as the first amorphous semiconductor film.

Further, if 100 to 100k Hz pulse modulation discharge is performed in the plasma CVD film deposition of the insulating film and the first amorphous semiconductor film, then particle generation due to the plasma CVD gas phase reaction can be prevented, and pinhole generation in the formed film can also be prevented, and therefore is preferable.

Further, in Embodiment 4 a second amorphous semiconductor film, containing an impurity element which imparts n-type conductivity is formed with a thickness of 20 to 80 nm as a semiconductor film containing a single conductivity type impurity element. For example, an a-Si:H film containing an n-type impurity element may be formed, and in order to do so, phosphine ($PH_3$) is added at a 0.1 to 5% concentration to silane ($SiH_4$). Alternatively, a hydrogenated microcrystalline silicon film ($\mu c$-Si:H) may also be used as a substitute for the second amorphous semiconductor film 106, containing an impurity element which imparts n-type conductivity.

These films can be formed in succession by appropriately changing the reaction gas. Further, these films can be laminated successively without exposure to the atmosphere at this time by using the same reaction chamber or a plurality of reaction chambers in the plasma CVD apparatus. By thus depositing successively these films without exposing the films to the atmosphere, the mixing in of impurities into the first amorphous semiconductor film can be prevented.

Note that it is possible to combine Embodiment 4 with any one of Embodiments 1 to 3.

Examples are shown in Embodiment 1 and Embodiment 4 of laminating an insulating film, a first amorphous semiconductor film, a second amorphous semiconductor film containing an impurity element which imparts n-type conductivity, and a first conductive film, in order and in succession. An example of an apparatus prepared with a plurality of chambers, and used for cases of performing this type of successive film deposition is shown in FIG. 10.

Figure 10:
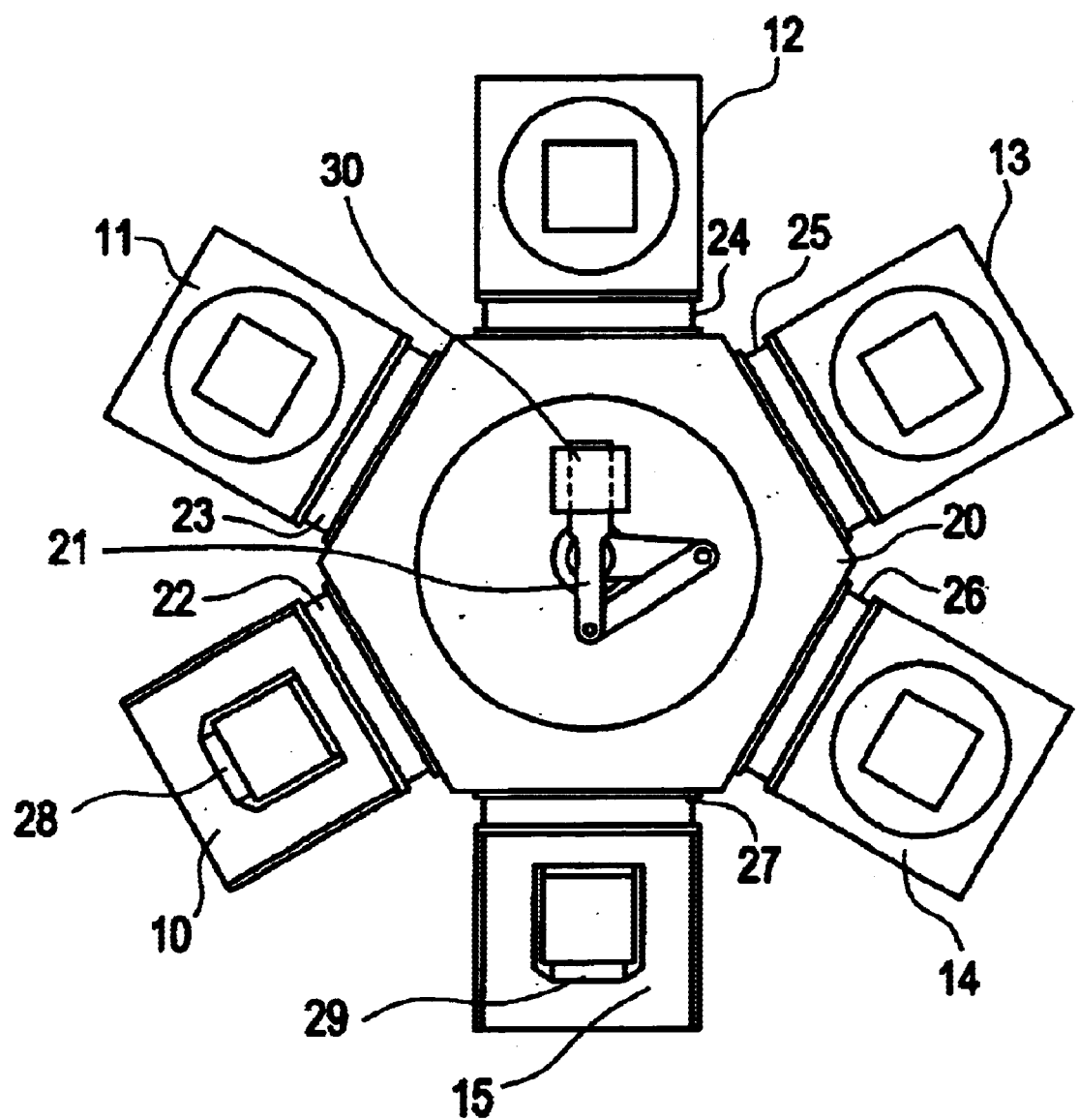
FIG. 10 A top view of a manufacturing device.

An outline of an apparatus (successive film deposition system), shown by Embodiment 5, is shown in FIG. 10 as seen from above. Reference numerals 10 to 15 in FIG. 10 denote chambers having airtight characteristics. A vacuum evacuation pump and an inert gas introduction system are arranged in each of the chambers.

The chambers denoted by reference numerals 10 and 15 are load-lock chambers for bringing test pieces (processing substrates) 30 into the system. The chamber denoted by reference numeral 11 is a first chamber for deposition of the insulating film 104. The chamber denoted by reference numeral 12 is a second chamber for deposition of the first amorphous semiconductor film 105. The chamber denoted by reference numeral 13 is a third chamber for deposition of the second amorphous semiconductor film 106 which imparts n-type conductivity. The chamber denoted by reference numeral 14 is a fourth chamber for deposition of the first conductive film 107. Further, reference numeral 20 denotes a common chamber of the test pieces, arranged in common with respect to each chamber.

An example of operation is shown below.

After pulling an initial high vacuum state in all of the chambers at first, a purge state (normal pressure) is made by using an inert gas, nitrogen here. Furthermore, a state of closing all gate valves 22 to 27 is made.

First, a cassette 28 loaded with a multiple number of processing substrates is placed into the load-lock chamber 10. After the cassette is placed inside, a door of the load-lock chamber (not shown in the figure) is closed. In this state, the gate valve 22 is opened and one of the processing substrates 30 is removed from the cassette, and is taken out to the common chamber 20 by a robot arm 21. Position alignment is performed in the common chamber at this time. Note that a substrate on which the wirings 101, 102, and 103 are formed, obtained in accordance with Embodiment 1, is used for the substrate 30.

The gate valve 22 is then closed, and a gate valve 23 is opened next. The processing substrate 30 is then moved into the first chamber 11. Film deposition processing is performed within the first chamber at a temperature of 150 to 300° C., and the insulating film 104 is obtained. Note that a film such as a silicon nitride film, a silicon oxide film, a silicon oxynitride film, or a lamination film of these films, can be used as the insulating film. A single layer silicon nitride film is employed in Embodiment 4, but a two-layer, three-layer, or higher layer lamination structure film may also be used. Note that a chamber capable of plasma CVD is used here, but a chamber which is capable of sputtering by use of a target may also be used.

After completing the deposition of the insulating film, the processing substrate is pulled out into the common chamber by the robot arm, and is then transported to the second chamber 12. Film deposition is performed within the second chamber at a temperature of 150 to 300° C., similar to that of the first chamber, and the first amorphous semiconductor film 105 is obtained by plasma CVD. Note that a film such as a microcrystalline semiconductor film, an amorphous germanium film, an amorphous silicon germanium film, or a lamination film of these films can be used as the first amorphous semiconductor film. Further, a heat treatment process for reducing the concentration of hydrogen may be omitted with a formation temperature of 350 to 500° C. for the first amorphous semiconductor film. Note that a chamber capable of plasma CVD is used here, but a chamber which is capable of sputtering by use of a target may also be used.

After completing deposition of the first semiconductor film, the processing substrate is pulled out into the common chamber and then transported to the third chamber 13. Film deposition process is performed within the third chamber at a temperature of 150 to 300° C., similar to that of the second chamber, and the second amorphous semiconductor film 106, containing an impurity element which imparts n-type conductivity (P or As), is obtained by plasma CVD. Note that a chamber capable of plasma CVD is used here, but a chamber which is capable of sputtering by use of a target may also be used.

After completing deposition of the second amorphous semiconductor film containing an impurity element which imparts n-type conductivity, the processing substrate is pulled out into the common chamber, and then is transported to the fourth chamber 14. The first conductive film 107 is obtained within the fourth chamber by sputtering using a metallic target.

The processed substrate, on which four layers have thus been formed in succession, is then transported to the load-lock chamber 15 by the robot arm, and is contained in a cassette 29.

Note that the apparatus shown in FIG. 10 is only one example. Further, it is possible to freely combine Embodiment 5 with any one of Embodiments 1 to 4.

Figure 11:
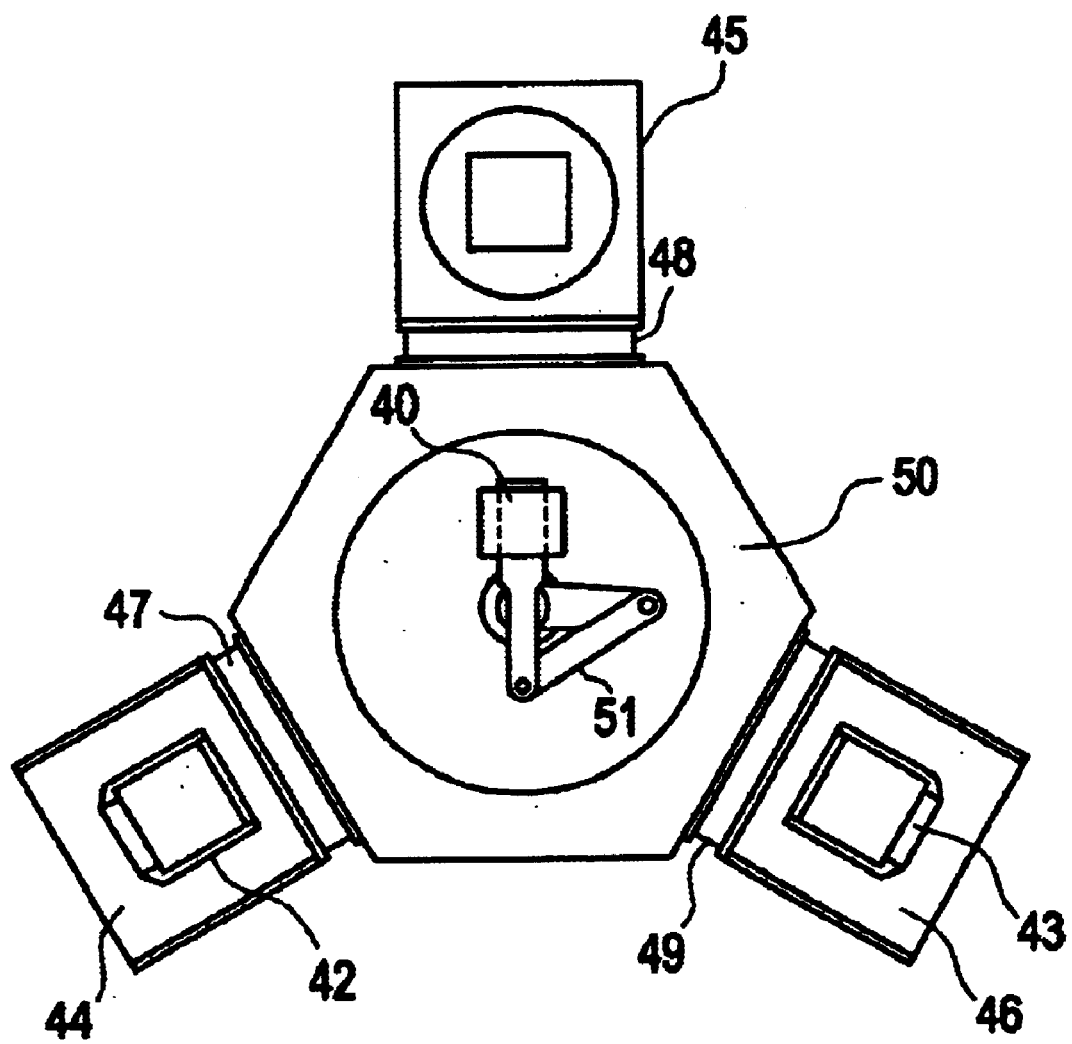
FIG. 11 A top view of a manufacturing device.

In Embodiment 5, an example of successive lamination using a plurality of chambers is shown, but in Embodiment 6 a method of successive lamination within one chamber maintained at high vacuum using the apparatus shown in FIG. 11 is employed.

The apparatus system shown in FIG. 11 is used in Embodiment 6. In FIG. 11, reference numeral 40 denotes a processing substrate, reference numeral 50 denotes a common chamber, 44 and 46 denote load-lock chambers, 45 denotes a chamber, and reference numerals 42 and 43 denote cassettes. In order to prevent contamination developing during transport of the substrate, lamination is performed in the same chamber in Embodiment 5.

It is possible to freely combine Embodiment 6 with any one of Embodiments 1 to 4.

Note that, when applied to Embodiment 1, a plurality of targets are prepared in the chamber 45, and the insulating film 104, the first amorphous semiconductor film 105, the second amorphous semiconductor film 106 containing an impurity element which imparts n-type conductivity, and the first conductive film 107 may be laminated by changing the reaction gas in order.

Further, when applied to Embodiment 4, the insulating film 104, the first amorphous semiconductor film 105, and the amorphous second semiconductor film 106, containing an impurity element which imparts n-type conductivity, may be laminated by changing the reaction gas in order.

In Embodiment 1, an example of forming the second amorphous semiconductor film containing an impurity element which imparts n-type conductivity by using sputtering is shown, but in Embodiment 7 an example of forming it by using plasma CVD is shown. Note that, except for the method of forming the second amorphous semiconductor film containing an impurity element which imparts n-type conductivity, Embodiment 7 is identical to Embodiment 1, and therefore only differing points are stated below.

If phosphine ($PH_3$) is added at a concentration of 0.1 to 5% with respect to silane ($SiH_4$) as a reaction gas using plasma CVD, then the second amorphous semiconductor film containing an impurity element which imparts n-type conductivity can be obtained.

In Embodiment 7, an example of forming the second amorphous semiconductor film containing an impurity element which imparts n-type conductivity by using plasma CVD is shown, and in Embodiment 8, an example of using a microcrystalline semiconductor film containing an impurity element which imparts n-type conductivity is shown.

By setting the substrate temperature from 80 to 300° C., preferably between 140 and 200° C., taking a gas mixture of silane diluted by hydrogen ($SiH_4:H_2=1:10$ to 100) and phosphine ($PH_3$) as the reaction gas, setting the gas pressure from 0.1 to 10 Torr, and setting the discharge power from 10 to 300 mW/cm$^2$, a microcrystalline silicon film can be obtained. Further, the film may be formed by adding phosphorous after film deposition of this microcrystalline silicon film by using plasma doping.

Figure 12:
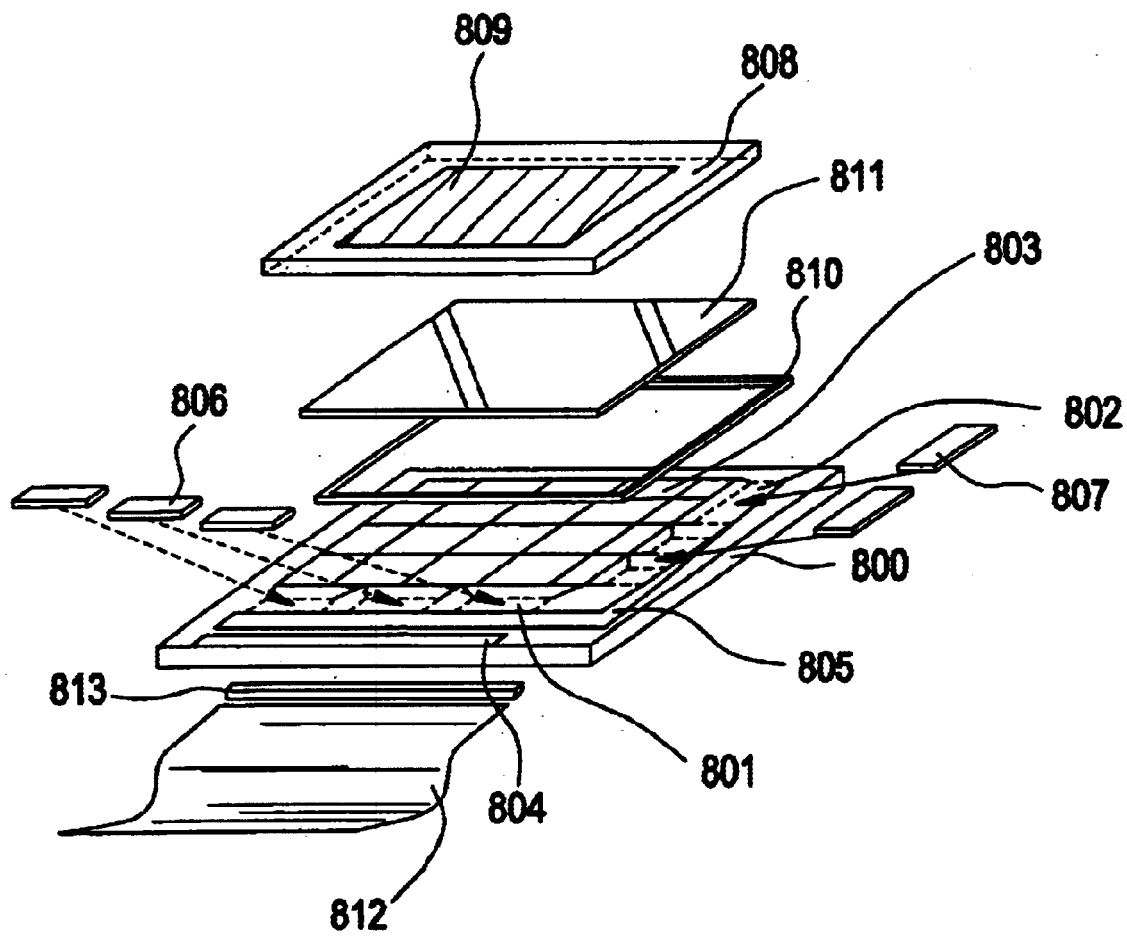
FIG. 12 A diagram showing an implementation of a liquid crystal display device.

FIG. 12 is a diagram which schematically shows a state of constructing an electro-optical display device by using the COG method. A pixel region 803, an external input-output terminal 804, and a connection wiring 805 are formed on a first substrate. Regions surrounded by dotted lines denote a region 801 for attaching a scanning line side IC chip, and a region 802 for attaching a data line side IC chip. An opposing electrode 809 is formed on a second substrate 808, and this is joined to the first substrate 800 by using a sealing material 810. A liquid crystal layer 811 is formed inside the sealing material 810 by injecting a liquid crystal. The first substrate and the second substrate are joined with a predetermined gap, and this is set from 3 to 8 μm for a nematic liquid crystal, and from 1 to 4 μm for a smectic liquid crystal.

IC chips 806 and 807 have circuit structures which differ between the data line side and the scanning line side. The IC chips are mounted on the first substrate. An FPC (flexible printed circuit) 812 is attached to the external input-output terminal 804 in order to input power supply and control signals from the outside. In order to increase the adhesion strength of the FPC 812, a reinforcing plate 813 may be formed. The electro-optical device can thus be completed. If an electrical inspection is performed before mounting the IC chips on the first substrate, then the final process yield of the electro-optical device can be improved, and the reliability can be increased.

Figure 13A:
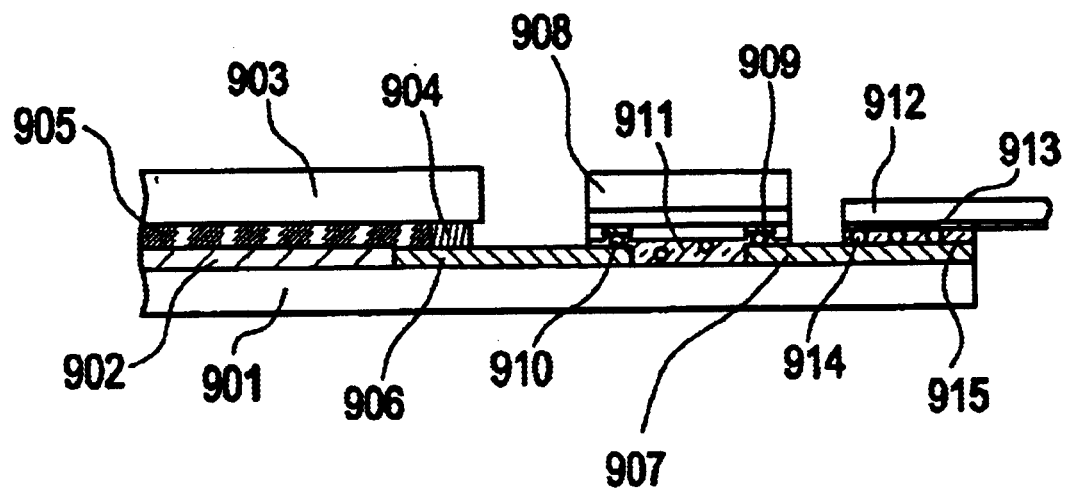
FIG. 13 Cross-sectional views showing an implementation structure of a liquid crystal display device.

Further, a method such as a method of connection using an anisotropic conductive material or a wire bonding method, can be employed as the method of mounting the IC chips on the first substrate. FIG. 13 shows examples of such. FIG. 13(A) shows an example in which an IC chip 908 is mounted on a first substrate 901 using an anisotropic conductive material. A pixel region 902, a lead wire 906, a connection wiring and an input-output terminal 907 are formed on the first substrate 901. A second substrate is bonded to the first substrate 901 by using a sealing material 904, and a liquid crystal layer 905 is formed therebetween.

Further, an FPC 912 is bonded to one edge of the connection wiring and the input-output terminal 907 by using an anisotropic conductive material. The anisotropic conductive material is made from a resin 915 and conductive particles 914 having a diameter of several tens to several hundred of μm and plated by a material such as Au, and the connection wiring 913 formed with the FPC 912 and the input-output terminal 907 are electrically connected by the conductive particles 914. The IC chip 908 is also similarly bonded to the first substrate by an anisotropic conductive material. An input-output terminal 909 provided with the IC chip 908 and the lead wire 906 or a connection wiring and the input-output terminal 907 are electrically connected by conductive particles 910 mixed into a resin 911.

Figure 13B:
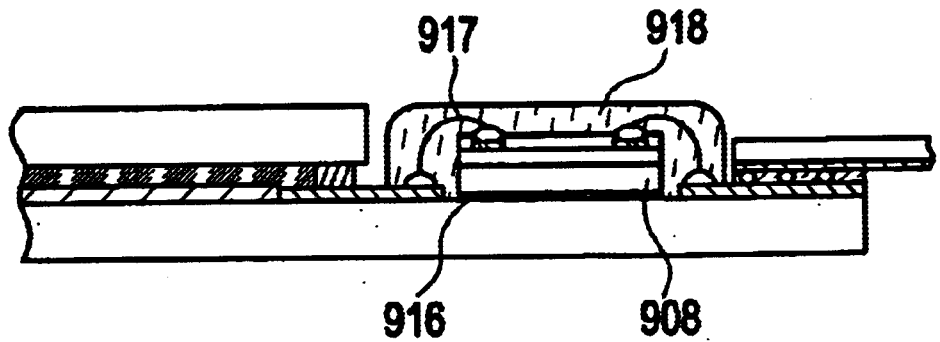

Furthermore, as shown by FIG. 13(B), the IC chip may be fixed to the first substrate by an adhesive material 916, and an input-output terminal of a stick driver and a lead wire or a connection wiring may be connected by an Au wire 917. Then, this is all sealed by a resin 918.

The method of mounting the IC chip is not limited to the method based on FIGS. 12 and 13, and it is also possible to use a known method not explained here, such as a COG method, a wire bonding method or a TAB method.

It is possible to freely combine Embodiment 9 with any one of Embodiments 1, and 3 to 8.

Figure 15:
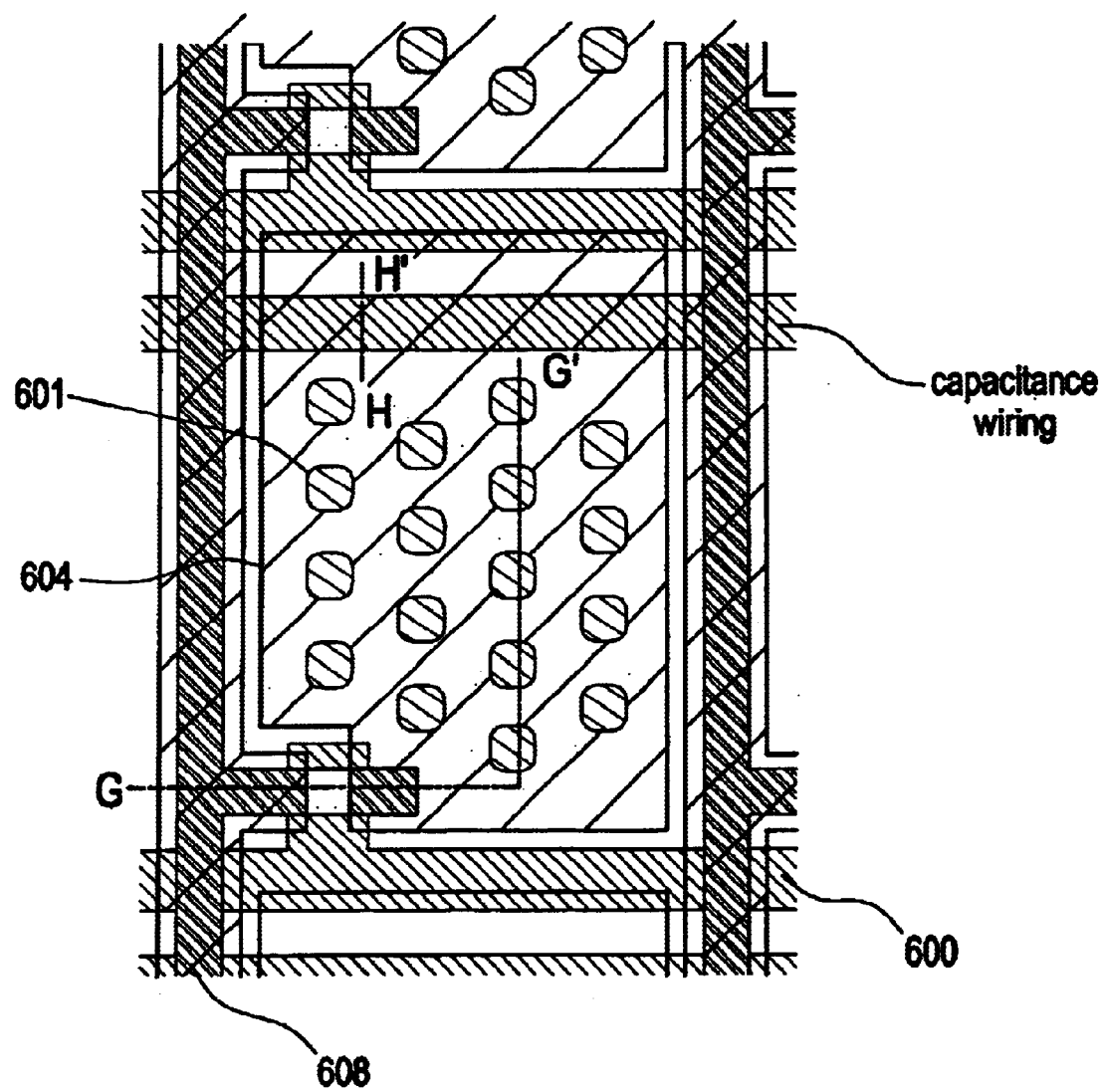
FIG. 15 A top view of the reflecting type electro-optical device.

In Embodiments 1, a method of manufacturing an active matrix substrate corresponding to a transmitting type electro-optical device is shown, but in Embodiment 10 an example of application to a reflecting type liquid crystal display device is shown, using FIGS. 14 and 15. FIG. 14 shows a cross-sectional view and FIG. 15 shows a top view, and the cross-sectional structure of the face cut along the dashed line G–G' in FIG. 15, and the cross-sectional structure corresponding to the face cut along the dashed line H–H' are shown in FIG. 14.

First, a substrate having an insulating surface is prepared. In addition to a substrate having light transmitting characteristics, such as a glass substrate, a quartz substrate, and a plastic substrate, a substrate, such as a semiconductor substrate, a stainless steel substrate, or a ceramic substrate, on which an insulating film is formed, may also be used as a substrate in Embodiment 10 due to the reflectivity of the liquid crystal display device.

Next, after forming a conductive film made from a metallic material on the substrate, using a first mask (photomask number 1), a gate wiring 600 and a convex portion 601 are formed. The convex portion is placed in a region surrounded by the gate wiring and the source wiring, namely a region in which a pixel electrode is formed and which becomes a display region. Note that there are no particular limitations placed on the shape of the convex portion 601, and a cross section in the diameter direction may be polygonal, and it may have an asymmetric shape. For example, the shape of the convex portion 601 may be a cylindrical shape or a prismatic shape, and may be a conic or pyramidal shape. Further, the convex portion 601 may be placed regularly or irregularly. In Embodiment 10 it is preferable for the gate wiring to have a tapered shape, and therefore the convex portion 601 is given a pyramidal shape having a tapered shape.

Next, the insulating film (gate insulating film) 602, a first amorphous semiconductor film, a second amorphous semiconductor film containing an impurity element which imparts n-type conductivity, and a first conductive film are laminated and formed in order. Note that a microcrystalline semiconductor film may also be used as a substitute for the amorphous semiconductor film, and that a microcrystalline semiconductor film containing an impurity element which imparts n-type conductivity may be used as a substitute for the amorphous semiconductor film containing an impurity element which imparts n-type conductivity. In addition, these films can be formed in succession, without exposure to the atmosphere, in a plurality of chambers or within the same chamber, using sputtering or plasma CVD. The mixing in of impurities can be prevented by having no exposure to the atmosphere.

The above insulating film 602 is formed on the substrate on which the convex portion 601 is formed, and has an uneven surface.

Next, by using a second mask (photomask number 2): the above first conductive film is patterned, forming a wiring (which later becomes a source wiring and an electrode (drain electrode)) from the first conductive film; the above second amorphous semiconductor film is patterned, forming a second amorphous semiconductor film containing an impurity element which imparts n-type conductivity; and the above first amorphous semiconductor film is patterned, forming a first amorphous semiconductor film.

A second conductive film is deposited next on the entire surface. Note that a conductive film having reflectivity is used as the second conductive film.

Next, by using a third mask (photomask number 3), the above second conductive film is patterned, forming the pixel electrode 604 from the second conductive film; the above wiring is patterned, forming the source wiring 618 and the electrode (drain electrode) 609; the second amorphous semiconductor film containing an impurity element which imparts n-type conductivity is patterned, forming the source region 608 and the drain region 607 from the second amorphous semiconductor film containing an impurity element which imparts n-type conductivity; and a portion of the above first amorphous semiconductor film is removed, forming the first amorphous semiconductor film 605.

The surface of the insulating film formed on the convex portion 601 is uneven, and the pixel electrode 604 is formed on the insulating film 602 which has the uneven surface, and therefore the surface of the pixel electrode 604 possesses unevenness, and the surface can be given light scattering characteristics.

Further, by using the structure of Embodiment 10 when manufacturing a pixel TFT portion, the number of photomasks used by the photolithography technique can be set to three. Conventionally, it was necessary to add a process of forming a uneven portion, but the convex portion is manufactured at the same time as the gate wiring in Embodiment 10, and therefore the uneven portion can be formed in the pixel electrode without any increase in the number of process steps.

Note that, Embodiment 10 can be freely combined with any one of Embodiments 2 to 8.

Embodiment 11 shows an example of using a plastic substrate (or a plastic film) as a substrate. Note that, except for the use of the plastic substrate as the substrate, Embodiment 11 is nearly identical to Embodiment 1, and therefore only differing points will be stated below.

PES (polyethylene sulfone), PC (polycarbonate), PET (polyethylene terephthalate) and PEN (polyethylene naphthalate) can be used as the plastic substrate material.

An active matrix substrate is completed using the plastic substrate provided that manufacturing is performed in accordance with Embodiment 1. Note that it is preferable to form the insulating film, the first amorphous semiconductor film, and the second amorphous semiconductor film containing an impurity element which imparts n-type conductivity by sputtering with the relatively low film deposition temperature.

A TFT having good characteristics can be formed on the plastic substrate, and the resulting display device can be made low weight. Further, it is possible to make a flexible electro-optical device because the substrate is plastic. Furthermore, assembly becomes easy.

Note that Embodiment 11 can be freely combined with any one of Embodiments 1 to 3,9, and 10.

An example of forming a protecting circuit in a region other than a pixel portion by utilizing the same material as that of a pixel electrode is shown in Embodiment 12 using FIG. 16.

Figure 16A:
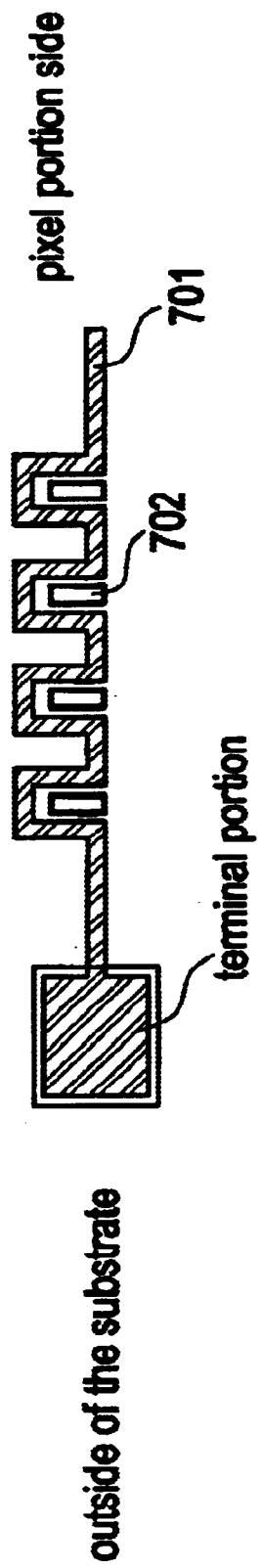
FIG. 16 A top view and a circuit diagram of a protecting circuit.

In FIG. 16(A), reference numeral 701 denotes a wiring, and shows a gate wiring, a source wiring, or a capacitor wiring extended from the pixel portion. Further, electrodes 701 are laid down in regions in which the wiring 701 is not formed, and are formed so as not to overlap the wiring 701. Embodiment 12 shows an example of forming the protecting circuit without increasing the number of masks, but there is no need to limit the structure to that of FIG. 16(A). For example, the number of masks may be increased and then, the protecting circuit may be formed by a protecting diode or a TFT.

Figure 16B:
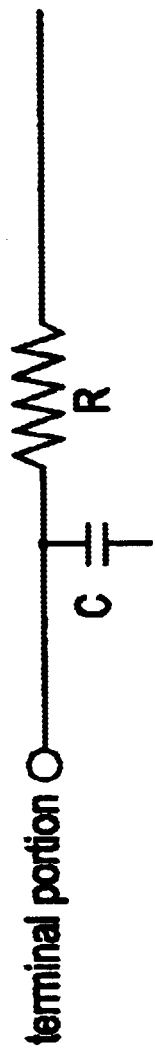

Further, FIG. 16(B) shows an equivalent circuit diagram.

By making this type of constitution, the generation of static electricity due to friction between production apparatuses and an insulating substrate can be prevented during the production process. In particular, the TFTs etc. can be protected from static electricity developing during a liquid crystal alignment process of rubbing performed during manufacture.

Note that Embodiment 12 can be freely combined with any one of Embodiments 1 to 11.

A bottom gate type TFT formed by implementing any one of the above Embodiments 1 to 12 can be used in various electro-optical devices (such as an active matrix liquid crystal display device, an active matrix EL display device, and an active matrix EC display device). Namely, the present invention can be implemented in all electronic appliance in which these electro-optical devices are built into a display portion.

The following can be given as such electronic equipment: a video camera, a digital camera, a projector (rear type or front type), a head-mounted display (goggle type display), a car navigation system, a car stereo, a personal computer, and a portable information terminal (such as a mobile computer, a portable telephone or an electronic book). Examples of these are shown in FIGS. 17 and 18.

Figure 17A:
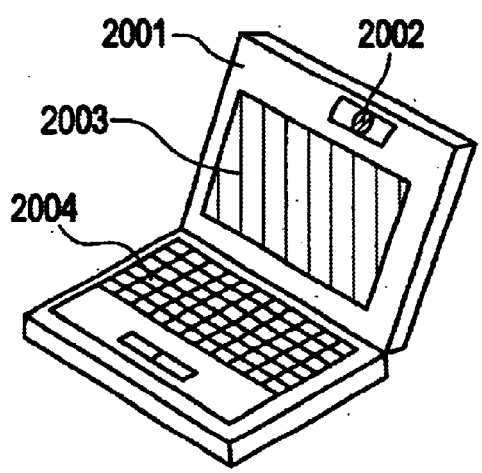
FIG. 17 Diagrams showing examples of electronic equipment.

FIG. 17(A) is a personal computer, and it includes a main body 2001, an image input portion 2002, a display portion 2003, and a keyboard 2004. The present invention can be applied to the display portion 2003.

Figure 17B:
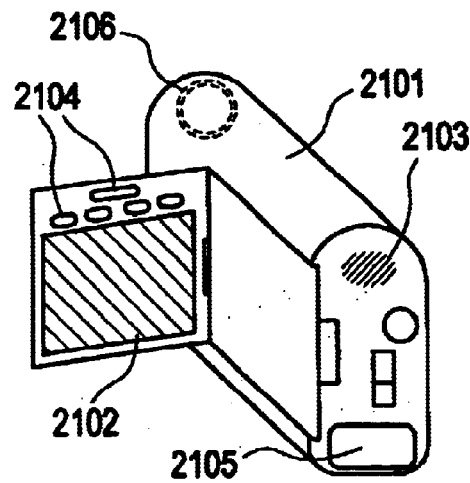

FIG. 17(B) is a video camera, and it includes a main body 2101, a display portion 2102, an audio input portion 2103, operation switches 2104, a battery 2105, and an image receiving portion 2106. The present invention can be applied to the display portion 2102.

Figure 17C:
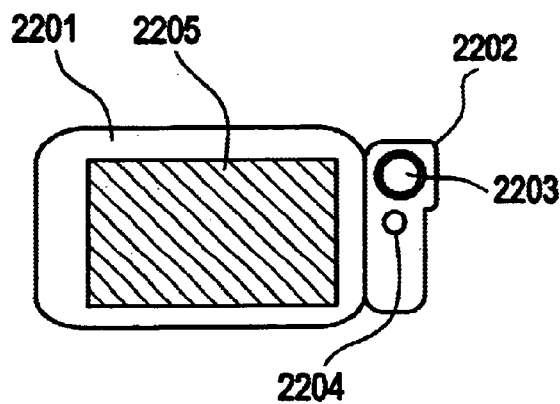

FIG. 17(C) is a mobile computer, and it includes a main body 2201, a camera portion 2202, an image receiving portion 2203, operation switches 2204, and a display portion 2205. The present invention can be applied to the display portion 2205.

Figure 17D:
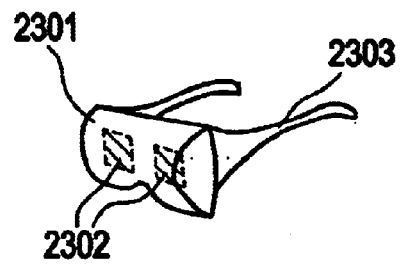

FIG. 17(D) is a goggle type display, and it includes a main body 2301, a display portion 2302, an arm portion 2303. The present invention can be applied to the display portion 2302.

Figure 17E:
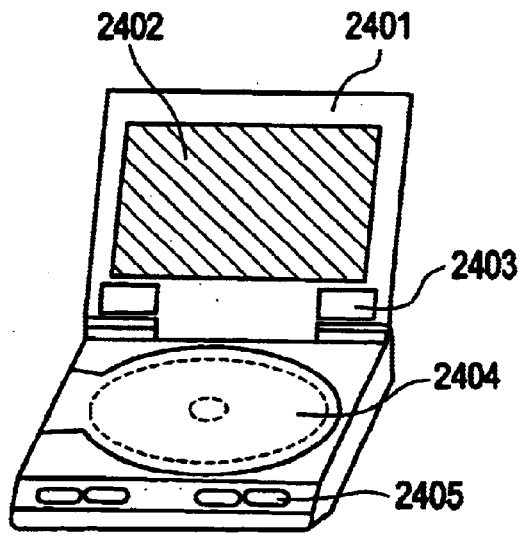

FIG. 17(E) is a player that uses a recording medium on which a program is recorded (hereafter referred to as a recording medium), and the player includes a main body 2401, a display portion 2402, a speaker portion 2403, a recording medium 2404, and operation switches 2405. Note that this player uses a recording medium such as a DVD (digital versatile disk) or a CD, and the appreciation of music, the appreciation of film, game playing and the Internet can be performed. The present invention can be applied to the display portion 2402.

Figure 17F:
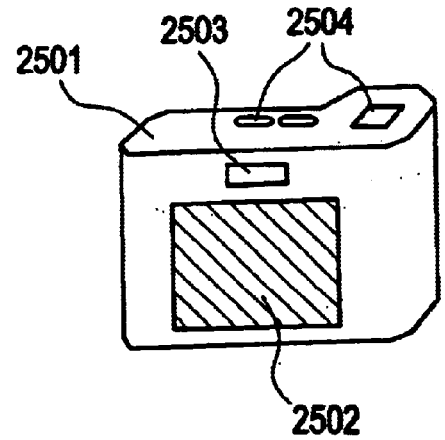

FIG. 17(F) is a digital camera, and it includes a main body 2501, a display portion 2502, an eyepiece portion 2503, operation switches 2504, and an image receiving portion (not shown in the figure). The present invention can be applied to the display portion 2502.

Figure 18A:
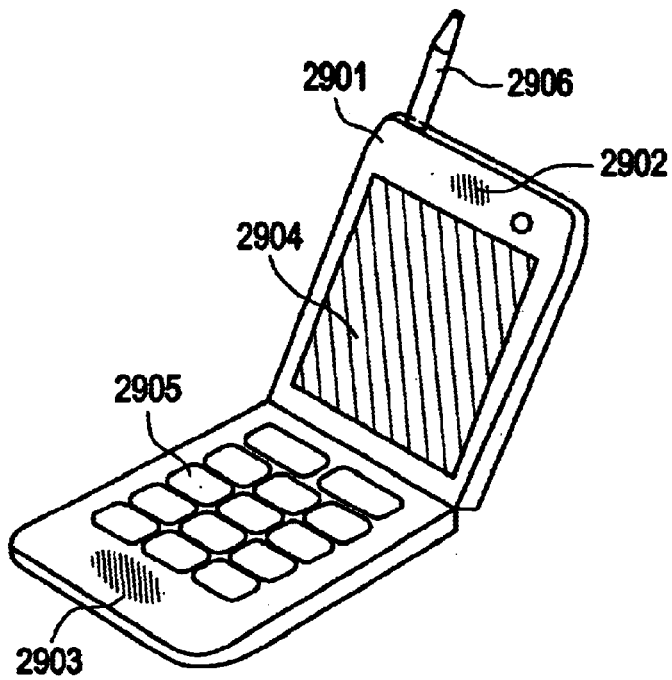
FIG. 18 Diagrams showing examples of electronic equipment.

FIG. 18(A) is a portable telephone, and it includes a main body 2901, an audio output portion 2902, an audio input portion 2903, a display portion 2904, operation switches 2905, and an antenna 2906. The present invention can be applied to the display portion 2904.

Figure 18B:
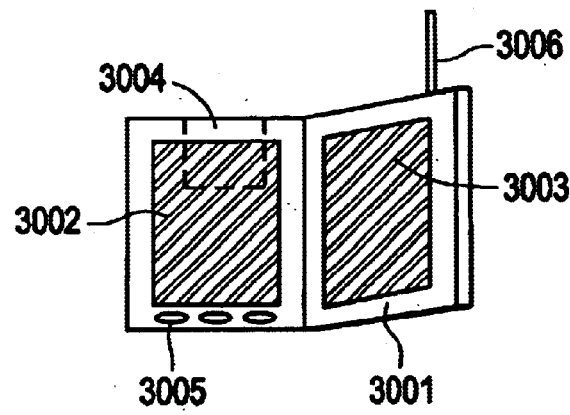

FIG. 18(B) is a portable book (electronic book), and it includes a main body 3001, display portions 3002 and 3003, a recording medium 3004, operation switches 3005, and an antenna 3006. The present invention can be applied to the display portions 3002 and 3003.

Figure 18C:
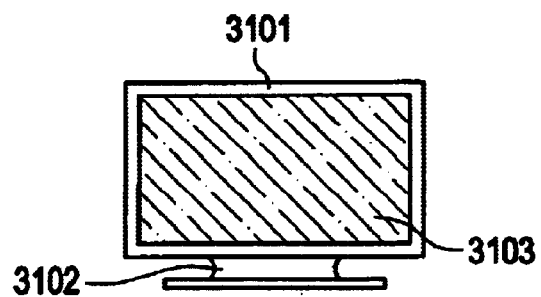

FIG. 18(C) is a display, and it includes a main body 3101, a support stand 3102, and a display portion 3103. The present invention can be applied to the display portion 3103. The display of the present invention is advantageous for a large size screen in particular, and is advantageous for a display equal to or greater than 10 inches (especially equal to or greater than 30 inches) in the opposite angle.

The applicable range of the present invention is thus extremely wide, and it is possible to apply the present invention to electronic equipment in all fields. Further, the electronic equipment of embodiment 13 can be realized by using a constitution of any combination of embodiments 1 to 12.

With the present invention, an electro-optical device prepared with a pixel TFT portion, having a reverse stagger type n-channel TFT, and a storage capacitor can be realized through three photolithography processes using three photomasks.

Further, when forming a protecting film, an electro-optical device prepared with a pixel TFT portion, having a reverse stagger type n-channel TFT protected by an inorganic insulating film, and a storage capacitor can be realized through four photolithography processes using four photomasks.

What is claimed is:

1. A semiconductor device comprising:
a gate wiring having a taper shape formed over an insulating surface;
an insulating film formed over said gate wiring;
an amorphous semiconductor film formed over said insulating film;
first and second impurity regions formed over said amorphous semiconductor film;
a source wiring including a first portion formed over one of said first impurity region and said second impurity region and a second portion extending in an orthogonal direction with respect to said gate wiring;
an electrode formed over the other of said first and said second impurity regions;
a pixel electrode formed over said electrode;
wherein said amorphous semconductor film and an amorphous semiconductor film containing an impurity element which imports n-type conductivity are laminated under the second portion of said souce wiring,
a capacitor portion comprising:
a layer comprising the conductive material over the insulating surface;
the insulating film formed over the layer; and
the pixel electrode extending over the insulating film,
a terminal portion comprising:
a first layer comprising the first conductive material over the insulating surface;
a second layer over the first layer, the second layer comprising the second conductive material.

2. A semiconductor device comprising:
a gate wiring formed over an insulating surface;
an insulating film formed over said gate wiring;
an amorphous semiconductor film formed over said insulating film;
first and second impurity regions formed over said amorphous semiconductor film;
a source wiring including a first portion formed over one of said first impurity region and said second impurity region and a second portion extending in an orthogonal direction with respect to said gate wiring;
an electrode formed over the other of said first and said second impurity regions;

a pixel electrode formed over said electrode;
a capacitor portion comprising:
  a layer comprising the conductive material over the insulating surface;
  the insulating film formed over the layer; and
  the pixel electrode extending over the insulating film,
a terminal portion comprising:
  a first layer comprising the first conductive material over the insulating surface;
  a second layer over the first layer, the second layer comprising the second conductive material.

3. A semiconductor device comprising:
a gate wiring formed over an insulating surface;
an insulating film formed over said gate wiring;
an amorphous semiconductor film formed over said insulating film;
first and second impurity regions formed on said amorphous semiconductor film;
a source wiring including a first portion formed over one of said first impurity region and said second impurity region and a second portion extending in an orthogonal direction with respect to said gate wiring;
an electrode formed over the other of said first and said second impurity region; and
a pixel electrode formed over said electrode;
wherein said amorphous semiconductor film and an amorphous semiconductor film containing an impurity element which imparts n-type conductivity are laminated under the second portion of said source wiring.

4. The semiconductor device as claimed in any one of claims 1 to 3, wherein said semiconductor device is a transmission type liquid crystal display device in which said pixel electrode is a transparent conductive film.

5. The semiconductor device as claimed in any one of claims 1 to 3, wherein said semiconductor device is a reflection type liquid crystal display device in which said pixel electrode is a film having Al or Ag as its main constituent, or a lamination film of such films.

6. A semiconductor device comprising:
a gate wiring having a taper shape and a convex portion formed over an insulating surface;
an insulating film formed over said gate wiring;
an amorphous semiconductor film formed over said insulating film;
first and second impurity regions formed over said amorphous semiconductor film;
a source wiring including a first portion formed over one of said first impurity region and said second impurity region and a second portion extending in an orthogonal direction with respect to said gate wiring;
an electrode formed over the other of said first and said second impurity regions; and
a pixel electrode possessing reflective characteristics and an uneven surface formed over said insulating film which is formed over said electrode and has an uneven surface
wherein said amorphous semiconductor film and an amorphous semiconductor film containing an impurity element which imparts n-type conductivity are laminated under the second portion of said source wiring,
a capacitor portion comprising:
  a layer comprising the conductive material over the insulating surface;
  the insulating film formed over the layer; and
  the pixel electrode extending over the insulating film,
a terminal portion comprising:
  a first layer comprising the first conductive material over the insulating surface;
  a second layer over the first layer, the second layer comprising the second conductive material.

7. The semiconductor device as claimed in claim 6, wherein said gate wiring and said convex portion are made from the same material.

8. The semiconductor device as claimed in claim 6 wherein one end surface of said first impurity region roughly corresponds with an end surface of said amorphous semiconductor film and said second portion, and one of end surface of said second impurity region roughly corresponds with an end surface of said amorphous semiconductor film and said electrode.

9. The semiconductor device as claimed in claim 8 wherein another end surface of said first impurity region roughly corresponds with an end surface of said first portion, and another end surface of said second impurity region roughly corresponds with an end surface of said electrode and an end surface of said pixel electrode.

10. The semiconductor device as claimed in claims 1, 2, 3, or 6, wherein said first and second impurity regions are made from an amorphous semiconductor film containing an impurity element which imparts n-type conductivity.

11. The semiconductor device as claimed in claims 1, 2, 3, or 6, wherein said insulating film, said amorphous semiconductor film, said first and second impurity regions are formed in succession without exposure to the atmosphere.

12. The semiconductor device as claimed in claims 1, 2, 3, or 6, wherein said insulating film, said amorphous semiconductor film, said first impurity region, or said second impurity region is formed by sputtering.

13. The semiconductor device as claimed in claims 1, 2, 3, or 6, wherein said insulating film, said amorphous semiconductor film, said first impurity region is, or said second impurity region is formed by plasma CVD.

14. The semiconductor device as claimed in claims 1, 2, 3, or 6, wherein said gate wiring is formed from a film comprising an element selected from the group consisting of Al, Cu, Ti, Mo, W, Ta, Nd, and Cr as the principle component, from an alloy film of said elements, or from a lamination film of said films.

15. The semiconductor device as claimed in claims 1, 2, 3, or 6, wherein said first impurity region and said second impurity region are formed by the same mask as said amorphous semiconductor film and said electrode.

16. The semiconductor device as claimed in claims 1, 2, 3, or 6, wherein said first impurity region and said second impurity region are formed by the same mask as said source wiring.

17. The semiconductor device as claimed in claims 1, 2, 3, or 6, wherein said first impurity region and said second impurity region are formed by the same mask as said source wiring and said pixel electrode.

18. The semiconductor device as claimed in claims 1, 2, 3, or 6, wherein said pixel electrode contacts said insulating film.

19. The semiconductor device as claimed in claims 1, 2, 3, or 6, wherein in said amorphous semiconductor film, the film thickness in a region contacting said first impurity region and said second impurity region is formed thicker than the film thickness in a region between the region contacting said first impurity region and the region contacting said second impurity region.

20. The semiconductor device as claimed in claims 1, 2, 3, or 6, wherein said semiconductor device is a personal computer, a video camera, a portable information terminal, a digital camera, a digital video disk player, or an electronic amusement device.

21. A semiconductor device comprising:
a gate wiring comprising a conductive material formed over an insulating surface;
an insulating film formed over said gate wiring;
an amorphous semiconductor film formed over said insulating film;
first and second impurity regions over said amorphous semiconductor film;
a source wiring including a first portion formed over one of said first and second impurity regions and a second portion extending in an orthogonal direction with respect to said gate wiring;
an electrode formed over the other of said first and second impurity regions; and
a pixel electrode formed over said electrode;
wherein one end surface of said first impurity region is coplanar with an end surface of said amorphous semiconductor film and said second portion, and one of end surface of said second impurity region is coplanar with an end surface of said amorphous semiconductor film and said electrode,
a capacitor portion comprising:
a layer comprising the conductive material over the insulating surface;
the insulating film formed over the layer; and
the pixel electrode extending over the insulating film.

22. A semiconductor device comprising:
a gate wiring comprising a conductive material formed over an insulating surface;
an insulating film formed over said gate wiring;
an amorphous semiconductor film formed over said insulating film;
first and second impurity regions over said amorphous semiconductor film;
a source wiring including a first portion formed over one of said first and second impurity regions and a second portion extending in an orthogonal direction with respect to said gate wiring;
an electrode formed over the other of said first and second impurity regions; and
a pixel electrode formed over said electrode;
a capacitor portion comprising:
a layer comprising the conductive material over the insulating surface;
the insulating film formed over the layer; and
the pixel electrode extending over the insulating film; and
a terminal portion comprising;
a first layer comprising the first conductive material over the insulating surface;
a second layer over the first layer, the second layer comprising second conductive material.

23. A semiconductor device comprising:
a gate wiring comprising a conductive material and a convex portion formed over an insulating surface;
an insulating film formed over said gate wiring;
an amorphous semiconductor film formed over said insulating film;
first and second impurity regions formed over said amorphous semiconductor film;
a source wiring including a first portion formed over one of said first and second impurity regions and a second portion extending in an orthogonal direction with respect to said gate wiring;
an electrode formed over the other of said first and second impurity regions; and
a pixel electrode formed over said electrode;
wherein said amorphous semiconductor film and an amorphous semiconductor film containing an impurity element which imparts n-type conductivity are laminated under the second portion of said source wiring,
a capacitor portion comprising:
a layer comprising the conductive material over the insulating surface;
the insulating film formed over the layer; and
the pixel electrode extending over the insulating film.

24. A semiconductor device comprising:
a gate wiring comprising a conductive material formed over an insulating surface;
an insulating film formed over said gate wiring;
an amorphous semiconductor film formed over said insulating film;
first and second impurity regions over said amorphous semiconductor film;
a source wiring including a first portion formed over said first impurity region and
a second portion extending in an orthogonal direction with respect to said gate wiring;
an electrode formed over the other of said first and second impurity regions; and
a pixel electrode possessing reflective characteristics and an uneven surface, formed over said insulating film which is formed over said electrode and has an uneven surface;
a capacitor portion comprising:
a layer comprising the conductive material over the insulating surface;
the insulating film formed over the layer; and
the pixel electrode extending over the insulating film.

25. A semiconductor device comprising:
a gate wiring comprising a first conductive material formed over an insulating surface;
an insulating film formed over said gate wiring;
an amorphous semiconductor film formed over said insulating film;
first and second impurity regions over said amorphous semiconductor film;
a source wiring including a first portion formed over one of said first and second impurity regions and a second portion extending in an orthogonal direction with respect to said gate wiring;
an electrode formed over the other of said first and second impurity regions; and
a pixel electrode comprising a second conductive material formed over said electrode;
a terminal portion comprising:
a first layer comprising the first conductive material over the insulating surface;
a second layer over the first layer, the second layer comprising the second conductive material.

26. A semiconductor device comprising:
a gate wiring having a taper shape comprising a first conductive material formed over an insulating surface;

an insulating film formed over said gate wiring;

an amorphous semiconductor film formed over said insulating film;

first and second impurity regions over said amorphous semiconductor film;

a source wiring including a first portion formed over one of said first and second impurity regions and a second portion extending in an orthogonal direction with respect to said gate wiring;

an electrode formed over the other of said first and second impurity regions;

a pixel electrode comprising a second conductive material formed over said electrode;

a terminal portion comprising:
   a first layer comprising the first conductive material over the insulating surface;
   a second layer over the first layer, the second layer comprising the second conductive material.

27. A semiconductor device comprising:

a gate wiring comprising a first conductive material and a convex portion formed over an insulating surface;

an insulating film formed over said gate wiring;

an amorphous semiconductor film formed over said insulating film;

first and second impurity regions formed over said amorphous semiconductor film;

a source wiring including a first portion formed over one of said first and second impurity regions and a second portion extending in an orthogonal direction with respect to said gate wiring;

an electrode formed over the other of said first and second impurity regions; and a pixel electrode comprising a second conductive material formed over said electrode;

wherein said amorphous semiconductor film and an amorphous semiconductor film containing an impurity element which imparts n-type conductivity are laminated under the second portion of said source wiring, a terminal portion comprising:
   a first layer comprising the first conductive material over the insulating surface;
   a second layer over the first layer, the second layer comprising the second conductive material.

28. A semiconductor device comprising:

a gate wiring comprising a first conductive material formed over an insulating surface;

an insulating film formed over said gate wiring;

an amorphous semiconductor film formed over said insulating film; first and second impurity regions over said amorphous semiconductor film;

a source wiring including a first portion formed over one of said first and second impurity regions and a second portion extending in an orthogonal direction with respect to said gate wiring;

an electrode formed over the other of said first and second impurity regions; and a pixel electrode comprising a second conductive material and possessing reflective characteristics and an uneven surface, formed over said insulating film which is formed over said electrode and has an uneven surface;

a terminal portion comprising:
   a first layer comprising the first conductive material over the insulating surface;
   a second layer over the first layer, the second layer comprising the second conductive material.

29. A semiconductor device comprising:

a gate wiring having a taper shape formed over an insulating surface;

an insulating film formed over said gate wiring;

an amorphous semiconductor film formed over said insulating film;

first and second impurity regions over said amorphous semiconductor film;

a source wiring including a first portion formed over one of said first and second impurity regions and a second portion extending in an orthogonal direction with respect to said gate wiring;

an electrode formed over the other of said first and second impurity regions; and a pixel electrode formed over said electrode.

30. A semiconductor device comprising:

a gate wiring having a taper shape formed over an insulating surface;

an insulating film formed over said gate wiring;

an amorphous semiconductor film formed over said insulating film;

first and second impurity regions over said amorphous semiconductor film;

a source wiring including a first portion formed over one of said first and second impurity regions and a second portion extending in an orthogonal direction with respect to said gate wiring;

an electrode formed over the other of said first and second impurity regions; and a pixel electrode formed over said electrode, and a capacitor portion comprising:
   a layer comprising the conductive material over the insulating surface;
   the insulating film formed over the layer; and
   the pixel electrode extending over the insulating film.

31. A semiconductor device comprising:

a gate wiring having a taper shape and a convex portion formed over an insulating surface;

an insulating film formed over said gate wiring;

an amorphous semiconductor film formed over said insulating film;

first and second impurity regions formed over said amorphous semiconductor film;

a source wiring including a first portion formed over one of said first and second impurity regions and a second portion extending in an orthogonal direction with respect to said gate wiring;

an electrode formed over the other of said first and second impurity regions; and a pixel electrode formed over said electrode;

wherein said amorphous semiconductor film and an amorphous semiconductor film containing an impurity element which imparts n-type conductivity are laminated under the second portion of said source wiring.

32. A semiconductor device comprising:

a gate wiring having a taper shape formed over an insulating surface;

an insulating film formed over said gate wiring;

an amorphous semiconductor film formed over said insulating film; first and second impurity regions over said amorphous semiconductor film;

a source wiring including a first portion formed over one of said first and second impurity regions and a second portion extending in an orthogonal direction with respect to said gate wiring;

an electrode formed over the other of said first and second impurity regions; and a pixel electrode possessing reflective characteristics and an uneven surface, formed over said insulating film which is formed over said electrode and has an uneven surface.

33. A semiconductor device according to claim 21, wherein said semiconductor device is a device selected from the group consisting of a personal computer, a video camera, a portable information terminal, a digital camera, a digital video disk player and an electronic amusement device.

34. A semiconductor device according to claim 22, wherein said semiconductor device is a device selected from the group consisting of a personal computer, a video camera, a portable information terminal, a digital camera, a digital video disk player and an electronic amusement device.

35. A semiconductor device according to claim 23, wherein said semiconductor device is a device selected from the group consisting of a personal computer, a video camera, a portable information terminal, a digital camera, a digital video disk player and an electronic amusement device.

36. A semiconductor device according to claim 24, wherein said semiconductor device is a device selected from the group consisting of a personal computer, a video camera, a portable information terminal, a digital camera, a digital video disk player and an electronic amusement device.

37. A semiconductor device according to claim 25, wherein said semiconductor device is a device selected from the group consisting of a personal computer, a video camera, a portable information terminal, a digital camera, a digital video disk player and an electronic amusement device.

38. A semiconductor device according to claim 26, wherein said semiconductor device is a device selected from the group consisting of a personal computer, a video camera, a portable information terminal, a digital camera, a digital video disk player and an electronic amusement device.

39. A semiconductor device according to claim 27, wherein said semiconductor device is a device selected from the group consisting of a personal computer, a video camera, a portable information terminal, a digital camera, a digital video disk player and an electronic amusement device.

40. A semiconductor device according to claim 28, wherein said semiconductor device is a device selected from the group consisting of a personal computer, a video camera, a portable information terminal, a digital camera, a digital video disk player and an electronic amusement device.

41. A semiconductor device according to claim 29, wherein said semiconductor device is a device selected from the group consisting of a personal computer, a video camera, a portable information terminal, a digital camera, a digital video disk player and an electronic amusement device.

42. A semiconductor device according to claim 30, wherein said semiconductor device is a device selected from the group consisting of a personal computer, a video camera, a portable information terminal, a digital camera, a digital video disk player and an electronic amusement device.

43. A semiconductor device according to claim 31, wherein said semiconductor device is a device selected from the group consisting of a personal computer, a video camera, a portable information terminal, a digital camera, a digital video disk player and an electronic amusement device.

44. A semiconductor device according to claim 32, wherein said semiconductor device is a device selected from the group consisting of a personal computer, a video camera, a portable information terminal, a digital camera, a digital video disk player and an electronic amusement device.

45. A semiconductor device according to claim 1, wherein one end surface of said impurity region is coplanar with an end surface of said amorphous semiconductor film and said second portion, and one of end surface of said second impurity region is coplanar with an end surface of said amorphous semiconductor film and said electrode.

46. A semiconductor device according to claim 2, wherein one end surface of said first impurity region is coplanar with an end surface of said amorphous semiconductor film and said second portion, and one of end surface of said second impurity region is coplanar with an end surface of said amorphous semiconductor film and said electrode.

47. A semiconductor device according to claim 21, wherein one end surface of said first impurity region is coplanar with an end surface of said amorphous semiconductor film and said second portion, and one of end surface of said second impurity region is coplanar with an end surface of said amorphous semiconductor film and said electrode.

48. A semiconductor device according to claim 22, wherein one end surface of said first impurity region is coplanar with an end surface of said amorphous semiconductor film and said second portion, and one of end surface of said second impurity region is coplanar with an end surface of said amorphous semiconductor film and said electrode.

49. A semiconductor device according to claim 25, wherein one end surface of said first impurity region is coplanar with an end surface of said amorphous semiconductor film and said second portion, and one of end surface of said second impurity region is coplanar with an end surface of said amorphous semiconductor film and said electrode.

50. A semiconductor device according to claim 26, wherein one end surface of said first impurity region is coplanar with an end surface of said amorphous semiconductor film and said second portion, and one of end surface of said second impurity region is coplanar with an end surface of said amorphous semiconductor film and said electrode.

51. A semiconductor device according to claim 29, wherein one end surface of said first impurity region is coplanar with an end surface of said amorphous semiconductor film and said second portion, and one of end surface of said second impurity region is coplanar with an end surface of said amorphous semiconductor film and said electrode.

52. A semiconductor device according to claim 30, wherein one end surface of said first impurity region is coplanar with an end surface of said amorphous semiconductor film and said second portion, and one of end surdace of said second impurity region is coplanar with an end surface of said amorphous semiconductor film and said electrode.

53. A semiconductor device according to claim 2, wherein another end surface of said first impurity region is coplanar with an end surface of said first portion, and another end surface of said second impurity region is coplanar with an end surface of said electrode and an end surface of said pixel electrode.

54. A semiconductor device according to claim 22, wherein another end surface of said first impurity region is coplanar with an end surface of said first portion, and another end surface of said second impurity region is coplanar with an end surface of said electrode and an end surface of said pixel electrode.

55. A semiconductor device according to claim 26, wherein another end surface of said first impurity region is coplanar with an end surface of said first portion, and another end surface of said second impurity region is coplanar with an end surface of said electrode and an end surface of said pixel electrode.

56. A semiconductor device according to claim 30, wherein another end surface of said first impurity region is coplanar with an end surface of said first portion, and another end surface of said second impurity region is coplanar with an end surface of said electrode and an end surface of said pixel electrode.

* * * * *